US012622283B2

(12) United States Patent
Lee et al.

(10) Patent No.: US 12,622,283 B2
(45) Date of Patent: May 5, 2026

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Ahreum Lee, Suwon-si (KR); Jimo Gu, Suwon-si (KR); Jiyoung Kim, Suwon-si (KR); Sukkang Sung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 566 days.

(21) Appl. No.: 18/172,534

(22) Filed: Feb. 22, 2023

(65) Prior Publication Data

US 2023/0378083 A1 Nov. 23, 2023

(30) Foreign Application Priority Data

May 17, 2022 (KR) ........................ 10-2022-0060351

(51) Int. Cl.
| | |
|---|---|
| *H01L 23/544* | (2006.01) |
| *H10B 41/10* | (2023.01) |
| *H10B 41/27* | (2023.01) |
| *H10B 43/10* | (2023.01) |
| *H10B 43/27* | (2023.01) |

(52) U.S. Cl.
CPC ........... *H01L 23/544* (2013.01); *H10B 41/10* (2023.02); *H10B 41/27* (2023.02); *H10B 43/10* (2023.02); *H10B 43/27* (2023.02); *H01L 2223/54426* (2013.01)

(58) Field of Classification Search
CPC ...................................................... H01L 23/544
See application file for complete search history.

(56) References Cited

U.S. PATENT DOCUMENTS

| | | | |
|---|---|---|---|
| 2020/0051922 A1* | 2/2020 | Wang | .................... H01L 23/544 |
| 2021/0193493 A1 | 6/2021 | Frost et al. | |
| 2021/0242136 A1 | 8/2021 | Chen et al. | |
| 2021/0327820 A1 | 10/2021 | Chen et al. | |
| 2022/0139456 A1* | 5/2022 | Lim | ........................ H10B 41/35 |
| | | | 257/314 |

FOREIGN PATENT DOCUMENTS

JP 4761934 B2 8/2011

* cited by examiner

*Primary Examiner* — Christopher A Johnson
(74) *Attorney, Agent, or Firm* — Fish & Richardson P.C.

(57) ABSTRACT

A semiconductor device may include an align key on a plate layer. The align key may include a first align layer connected to a second align layer. The first align layer may have a first length in a first direction, a second length in a second direction, and an air gap in the first align layer. The second align layer may be on the first align layer and may have a third length. The first direction may be perpendicular to an upper surface of the plate layer. The second length may be smaller than the first length. The third length may be smaller than the second length in the second direction.

19 Claims, 23 Drawing Sheets

10a

10b

SEMICONDUCTOR DEVICES AND DATA STORAGE SYSTEMS INCLUDING THE SAME

CROSS-REFERENCE TO RELATED APPLICATION(S)

This application claims benefit of priority to Korean Patent Application No. 10-2022-0060351, filed on May 17, 2022 in the Korean Intellectual Property Office, the disclosure of which is incorporated herein by reference in its entirety.

BACKGROUND

Example embodiments of the present disclosure relate to a semiconductor device and a data storage system including the same.

A semiconductor device able to store high-capacity data in a data storage system requiring data storage may be necessary. Accordingly, a method for increasing data storage capacity of a semiconductor device has been researched. For example, as a method for increasing data storage capacity of a semiconductor device, a semiconductor device including memory cells arranged three-dimensionally, instead of memory cells arranged two-dimensionally, has been suggested.

SUMMARY

An example embodiment of the present disclosure provides a semiconductor device having improved reliability.

An example embodiment of the present disclosure provides a data storage system including a semiconductor device having improved reliability.

According to an example embodiment of the present disclosure, a semiconductor device may include a plate layer; and an align key on the plate layer. The align key may include a first align layer and a second align layer connected to the first align layer. The first align layer may have a first length in a first direction, a second length in a second direction, and an air gap in the first align layer. The first direction may be perpendicular to an upper surface of the plate layer. The second length may be smaller than the first length. The second direction may be perpendicular to the first direction. The second align layer may be on the first align layer. The second align layer may have a third length. The third length may be smaller than the second length in the second direction.

According to an example embodiment of the present disclosure, a semiconductor device may include a substrate including a plate layer; an align key on substrate; and a light transmissive layer. The align key may include a first align layer and a second align layer stacked in order in a first direction perpendicular to an upper surface of the plate layer. The first align layer and the second align layer may be connected to each other. The light transmissive layer may be on a side surface of the second align layer. The first align layer and the second align layer may overlap each other in the first direction.

According to an example embodiment of the present disclosure, a data storage system may include a semiconductor storage device including a plate layer, circuit devices below the plate layer, and an input/output pad electrically connected to the circuit devices, the semiconductor storage device having a first region and a second region, and a controller electrically connected to the semiconductor storage device through the input/output pad and configured to control the semiconductor storage device. The semiconductor storage device may further include a stack structure in the first region, the stack structure including gate electrodes stacked and spaced apart from each other in a first direction perpendicular to an upper surface of the plate layer; a channel structure penetrating through the stack structure and in contact with the plate layer in the first region; a through-via extending in the first direction and penetrating through the stack structure in the first region, the through-via being electrically connected to the circuit devices, and the through-via including a first via layer and a second via layer stacked in order in the first direction; a mold structure including horizontal sacrificial layers stacked and spaced apart from each other in the first direction in the second region; and an align key penetrating through the mold structure in the second region, the align key extending in the first direction, and the align key including a first align layer and a second align layer stacked in order in the first direction. The first align layer and the second align layer may overlap each other in the first direction.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION

As used herein, the term "and/or" includes any and all combinations of one or more of the associated listed items.

Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, embodiments of the present disclosure will be described as follows with reference to the accompanying drawings.

Figure 1A:
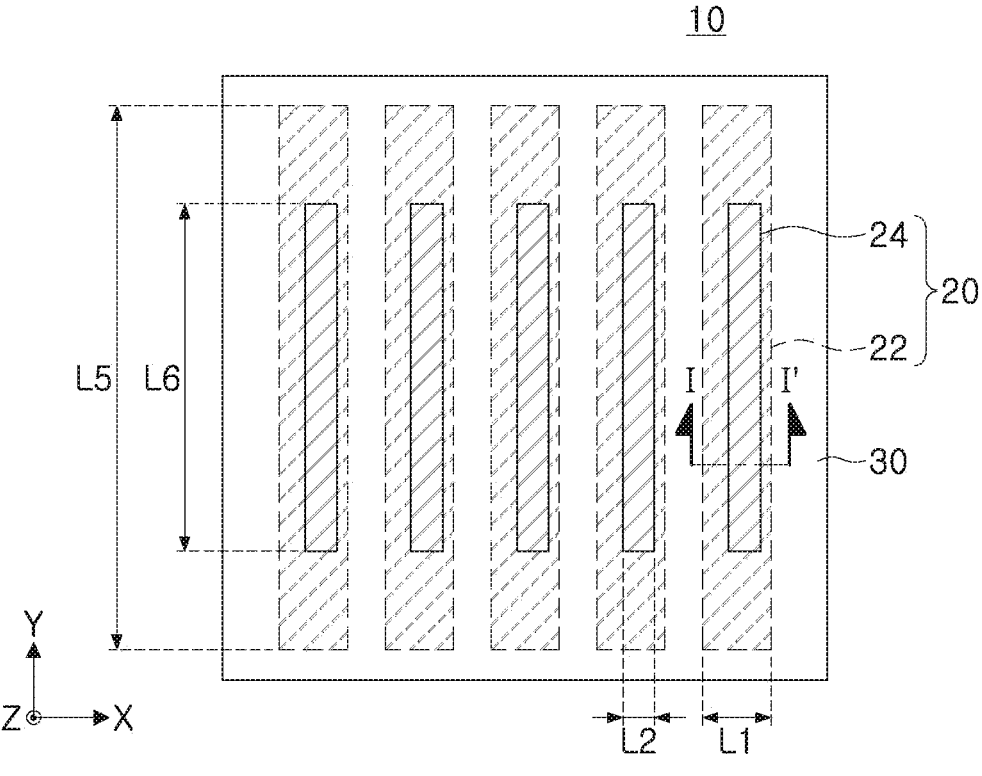
FIGS. 1A and 1B are a plan view and a cross-sectional view illustrating a semiconductor device according to an example embodiment of the present disclosure.
Figure 1B:
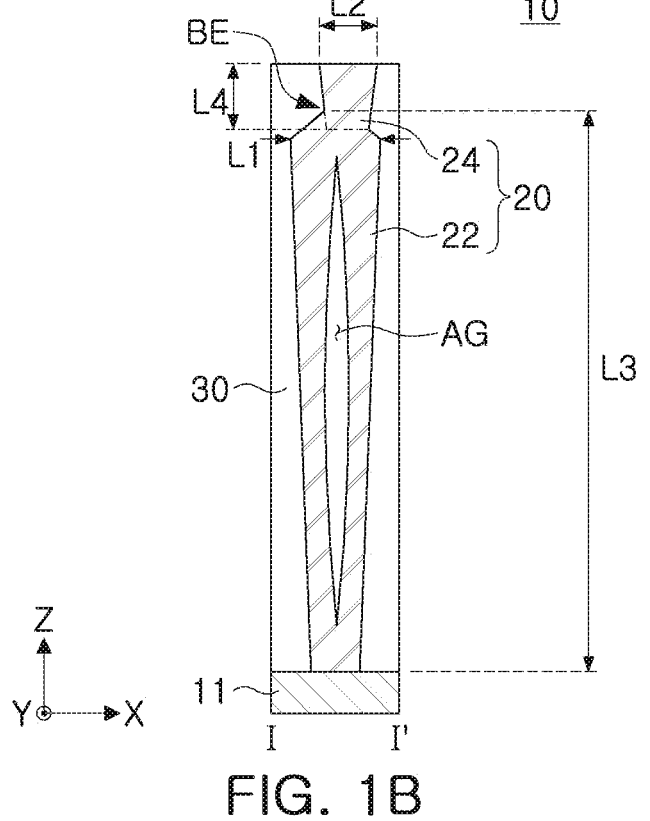

FIGS. 1A and 1B are a plan view and a cross-sectional view illustrating a semiconductor device according to an example embodiment. FIG. 1B is a cross-sectional view taken along line I-I' in FIG. 1A.

Referring to FIGS. 1A and 1B, a semiconductor device 10 may include a plate layer 11, align keys 20 disposed on the plate layer 11, and a light transmissive layer 30 covering side surfaces of the align keys 20.

The plate layer 11 may be a lower structure on which align keys 20 are disposed. The plate layer 11 may include a substrate including a semiconductor material, and may further include a semiconductor structure disposed on the substrate in some example embodiments. The semiconductor structure may include layers forming at least a portion of a semiconductor device.

The align keys 20 may form an align key structure for alignment between upper and lower patterns during a photolithography process during a process of manufacturing the semiconductor device 10. The align key 20 may be a transmissive align key using light reflected from the align key, differently from the stepped align key in which a step is formed on the upper surface thereof. Accordingly, the align key 20 may have a substantially flat upper surface without a step difference. Each of the align keys 20 may have a rectangular shape, a line shape, an elongated shape, or an elliptical shape extending in one direction, that is, for example, a y direction, on a plan view, as illustrated in FIG. 1A, and may be spaced apart from each other in an x direction. However, the arrangement shape and size of the align keys 20 included in the align key structure may be varied in the example embodiments.

The align key 20 may be disposed on the plate layer 11, and may include first and second align layers 22 and 24 stacked in a vertical direction, that is, for example, a z direction. The first and second align layers 22 and 24 may be connected to each other and may form an integrated layer or a single layer. In the example embodiment, the second align layer 24 may be shifted to one side, such as, for example, to the right side from a central axis of the first align layer 22 in the x direction. A bent portion BE may be formed between the first align layer 22 and the second align layer 24 as the width changes. As illustrated in FIG. 1A, the first align layer 22 may have a size larger than that of the second align layer 24 on a plan view. Accordingly, on a plan view, the second align layer 24 may be disposed within an outer perimeter of the first align layer 22, and an entirety of the second align layer 24 may overlap the first align layer 22 in the z direction.

The first align layer 22 may have a first length L1 in a direction horizontal to the upper surface of the plate layer 11, that is, for example, the x direction, and the second align layer 24 may have a second length L2 smaller than the first length L1. The first length L1 and the second length L2 may be a maximum length. However, the above-described relationship may be equally applied to an average length or a length in a region in which the first and second align layers 22 and 24 are connected to each other. The first align layer 22 may have a third length L3 in the z direction, and the second align layer 24 may have a fourth length L4 smaller than the third length L3. The third length L3 may be greater than the first length L1. A ratio of the third length L3 to the first length L1 (L3:L1) may be equal to and greater than about 10:1, such as, for example, in a range of about 10:1 to about 100:1. The first align layer 22 may have a fifth length L5 in the y direction, and the second align layer 24 may have a sixth length L6 smaller than the fifth length L5.

The width of the first align layer 22 on the lower surface may be smaller than the width on the upper surface. The first align layer 22 may have a shape of which the width may decrease toward the plate layer 11 due to a high aspect ratio, but an example embodiment thereof is not limited thereto. The upper surface of the first align layer 22 may have a conical shape or a shape similar thereto, and accordingly, the upper end of the first align layer 22 may be disposed on the highest level in the center. However, in example embodiments, the upper surface of the first align layer 22 may have a flat shape. The first align layer 22 may include an air gap AG therein. The air gap AG may be formed as a deposition material penetrates through an opening corresponding to the second align layer 24 having a relatively narrow width and is deposited such that the first align layer 22 is formed, when the align key 20 is formed. However, in example embodiments, the size and shape of the air gap AG may be varied.

The second align layer 24 may be connected to the first align layer 22 by being partially recessed into the first align layer 22. The second align layer 24 may also have a shape of which the width decreases toward the plate layer 11, and a width on the lower surface may be smaller the width on the upper surface, but an example embodiment thereof is not limited thereto. The second align layer 24 may not include an air gap therein.

The first and second align layers 22 and 24 may include a conductive material. The conductive material may form an integrated layer or a single layer in the first and second align layers 22 and 24. For example, the first and second align layers 22 and 24 may be formed of a metal material among at least one of tungsten (W), aluminum (Al), and copper (Cu), or a semiconductor material such as silicon (Si). However, in a range in which the first and second align layers 22 and 24 include a reflective material, materials of the first and second align layers 22 and 24 may be varied.

The light transmissive layer 30 may be disposed to surround side surfaces of the align keys 20. The light transmissive layer 30 may include a lower layer disposed on the same level as a level of the first align layer 22 and an upper layer disposed on the same level as a level of the second align layer 24. However, when the lower layer and the upper layer in the light transmissive layer 30 are formed of the same material, an interfacial surface therebetween may not be distinct. The light transmissive layer 30 may be formed of a material through which light may be transmitted. Accordingly, on a plan view, the second align layer 24 and also the first align layer 22 may be recognized, and at least one of the first and second align layers 22 and 24 may be used to align. The light transmissive layer 30 may include, for example, an insulating material. The light transmissive layer 30 may include, for example, silicon oxide, silicon nitride, or silicon oxynitride.

Figure 2A:
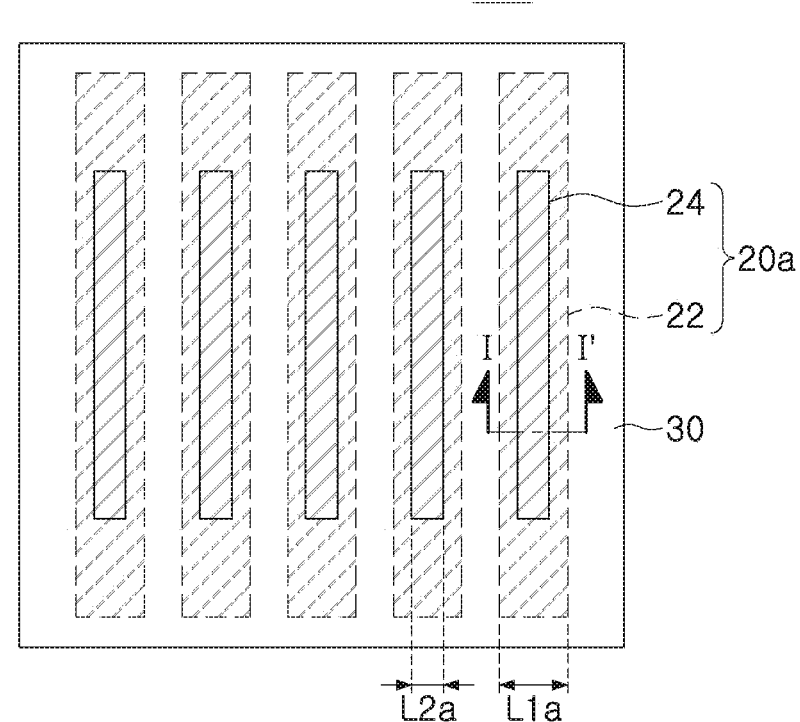
FIGS. 2A and 2B are a plan view and a cross-sectional view illustrating a semiconductor device according to an example embodiment of the present disclosure.
Figure 2B:
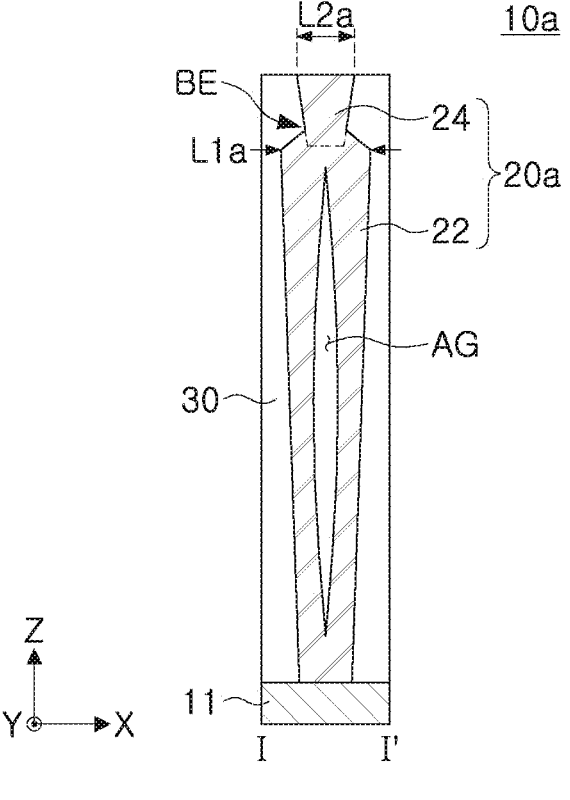

FIGS. 2A and 2B are a plan view and a cross-sectional view illustrating a semiconductor device according to an example embodiment, illustrating a region corresponding to FIGS. 1A and 1B.

Referring to FIGS. 2A and 2B, in the align key 20a of the semiconductor device 10a, the second align layer 24 may be disposed such that a central axis thereof in the x direction of the second align layer 24 may be arranged to coincide with the central axis of the first align layer 22. In the example embodiment, the first align layer 22 may have a first length L1a in a direction horizontal to the upper surface of the plate layer 11, that is, for example, in the x direction, and the second align layer 24 may have a second length L2a smaller than the first length L1a.

As such, in example embodiments, the alignment degree of the first align layer 22 and the second align layer 24 may be varied.

Figure 3A:
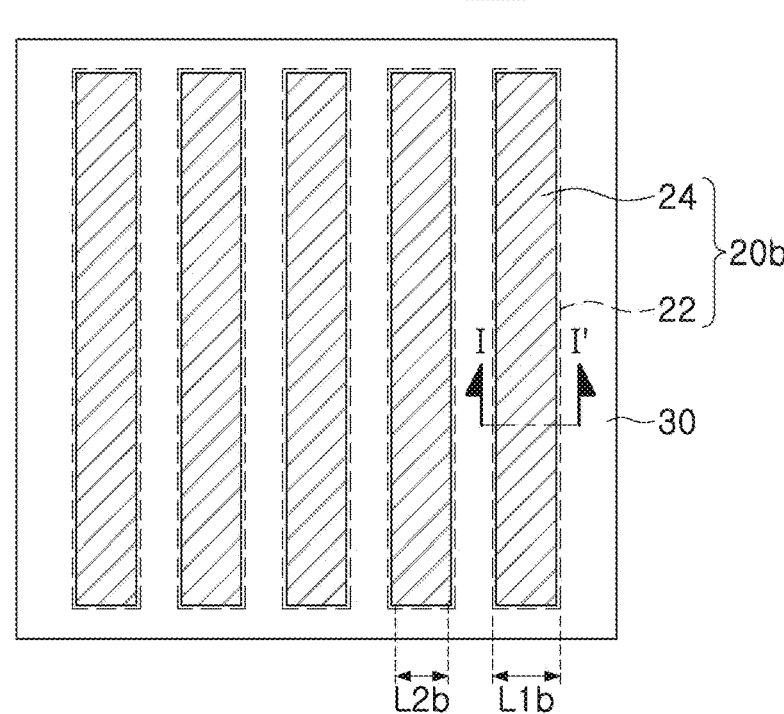
FIGS. 3A and 3B are a plan view and a cross-sectional view illustrating a semiconductor device according to an example embodiment of the present disclosure.
Figure 3B:
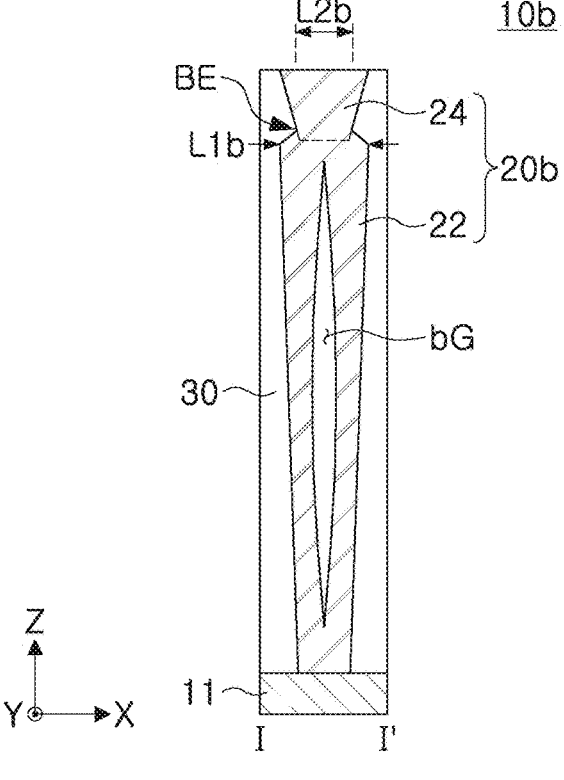

FIGS. 3A and 3B are a plan view and a cross-sectional view illustrating a semiconductor device according to an example embodiment, illustrating a region corresponding to FIGS. 1A and 1B.

Referring to FIGS. 3A and 3B, in the align key 20b of the semiconductor device 10b, the first align layer 22 may have a first length L1b in a direction horizontal to the upper surface of the plate layer 11, that is, for example, the x direction, and the second align layer 24 may have a second length L2b substantially equal to the first length L1b.

The first length L1b and the second length L2b may be a maximum length or a maximum width of the first and second align layers 22 and 24, respectively. Accordingly, on the plan view in FIG. 3A, the external peripheral surfaces of the first and second align layers 22 and 24 may overlap or may almost overlap. In this case, a bent portion BE according to a change in width may be formed in a region in which the first align layer 22 and the second align layer 24 are connected to each other.

As in the example embodiment in FIGS. 2A and 2B, the second align layer 24 may be disposed such that a central axis in the x direction may coincide with a central axis of the first align layer 22. However, in some example embodiments, as in the example embodiment in FIGS. 1A and 1B, the central axis of the second align layer 24 in the x direction may not coincide with the central axis of the first align layer 22.

As such, in example embodiments, the relative length of the plate layer 11 of the first align layer 22 and the second align layer 24 in one direction horizontal to the upper surface of the plate layer 11 may be varied in a range in which the length of the phosphor layer 24 may be the same as or smaller than the length of the first align layer 22.

Figure 4A:
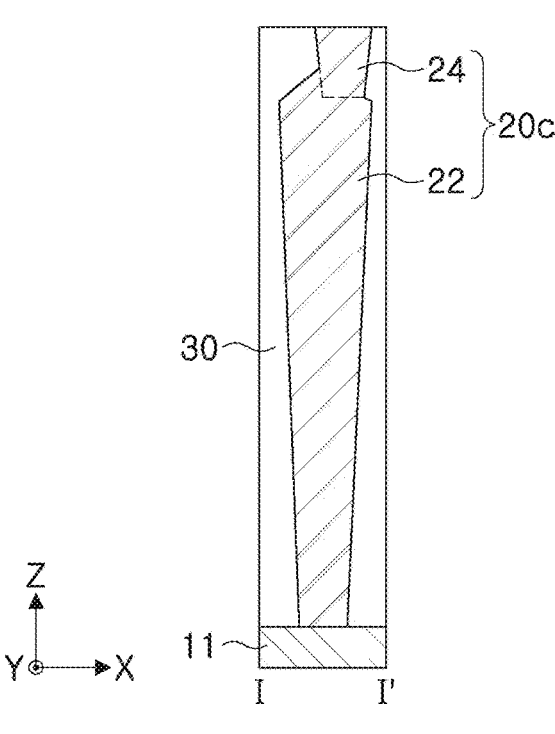
FIGS. 4A and 4B are cross-sectional views illustrating a semiconductor device according to an example embodiment of the present disclosure.
Figure 4B:
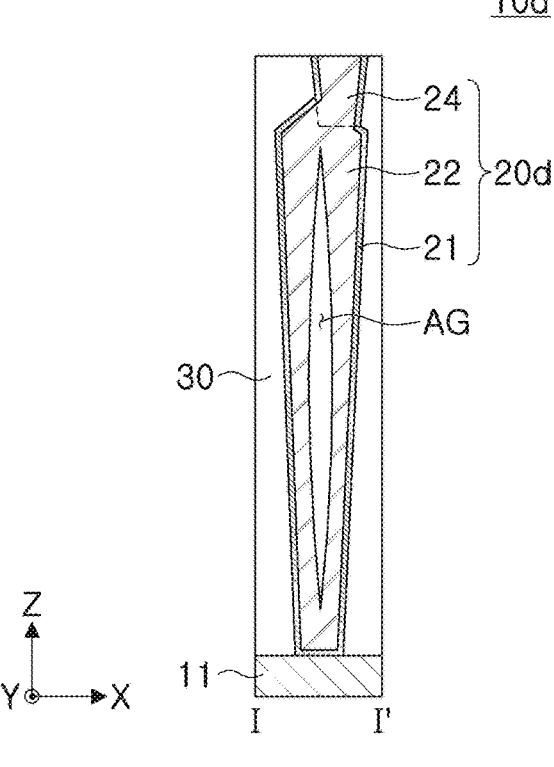

FIGS. 4A and 4B are cross-sectional views illustrating a semiconductor device according to an example embodiment, illustrating a region corresponding to FIG. 1B.

Referring to FIG. 4A, in the align key 20c of the semiconductor device 10c, the first align layer 22 may not include an air gap, which may be due to a material included in the align key 20c and/or conditions of a process of forming the align key 20c.

Referring to FIG. 4B, the align key 20d of the semiconductor device 10d may further include a barrier layer 21 covering external side surfaces of the first and second align layers 22 and 24.

The barrier layer 21 may be, for example, a diffusion barrier or a protective layer of the material of the first and second align layers 22 and 24. The barrier layer 21 may continuously extend while covering external surfaces of the first and second align layers 22 and 24. The barrier layer 21 may extend from a side surface of the second align layer 24 along side surfaces and a lower surface of the first align layer 22. The barrier layer 21 may include, for example, tungsten nitride (WN), tantalum nitride (TaN), titanium nitride (TiN), or a combination thereof.

Figure 5A:
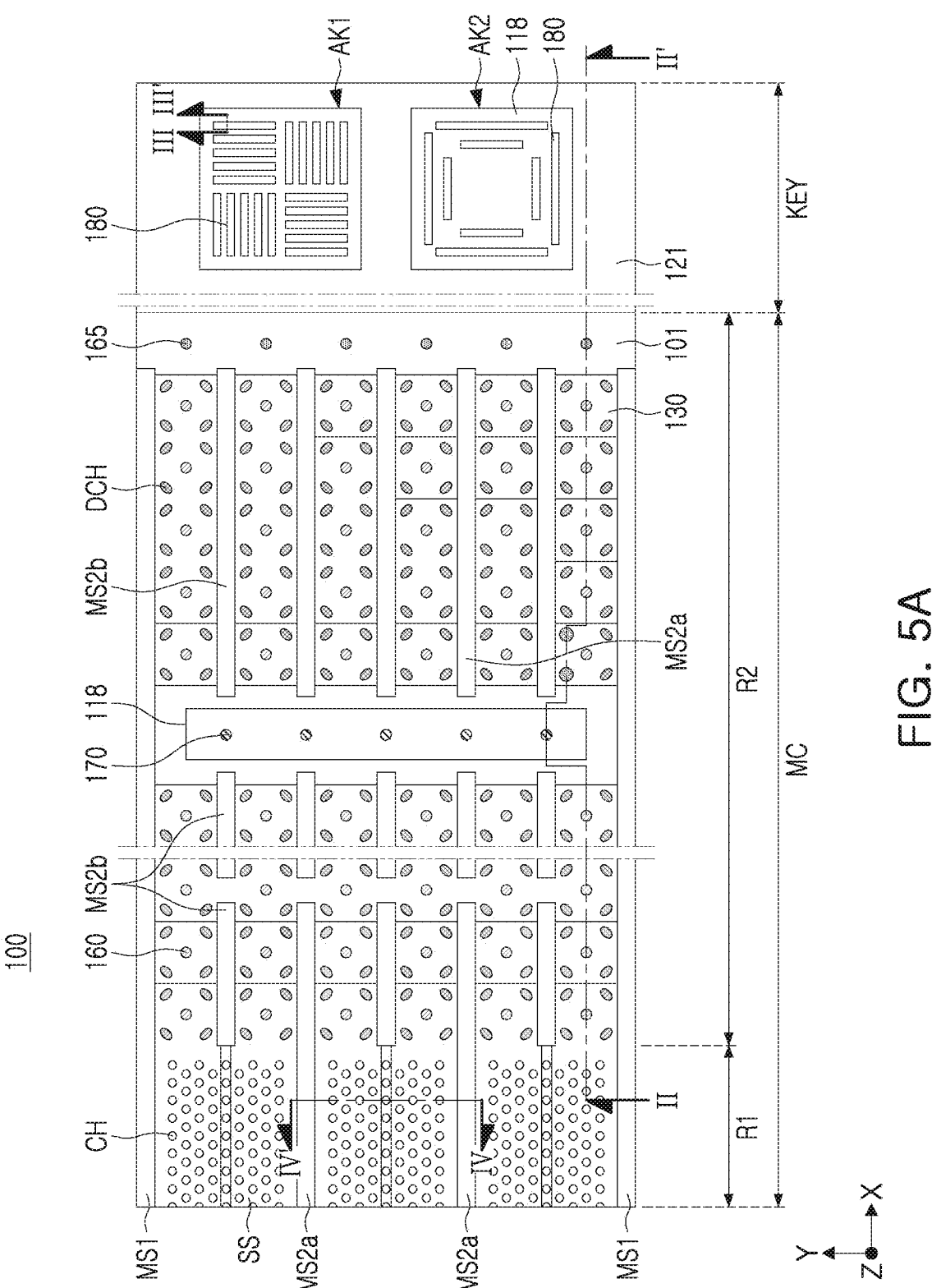
FIGS. 5A to 5C are a plan view and cross-sectional views illustrating a semiconductor device according to an example embodiment of the present disclosure.
Figure 5B:
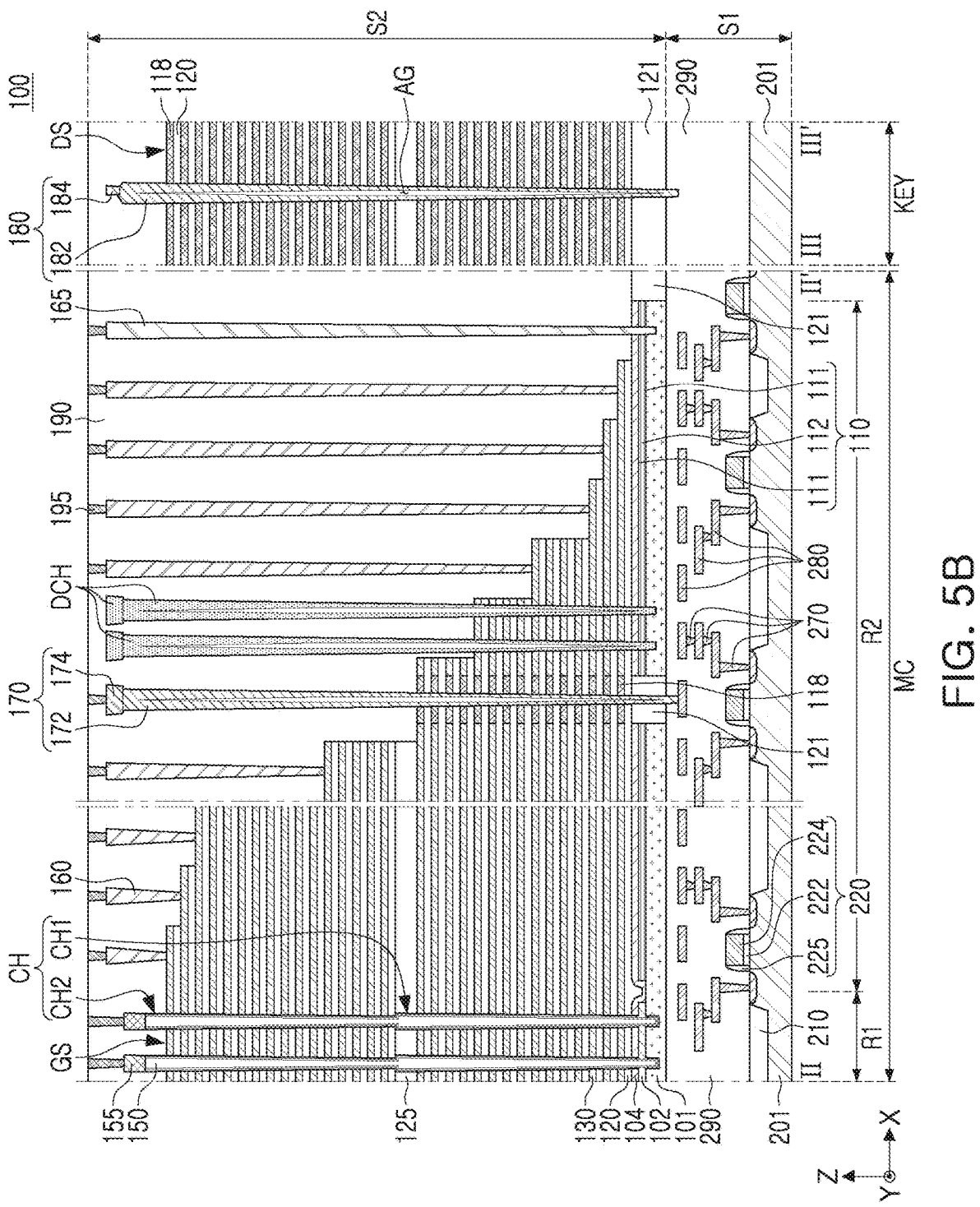
Figure 5C:
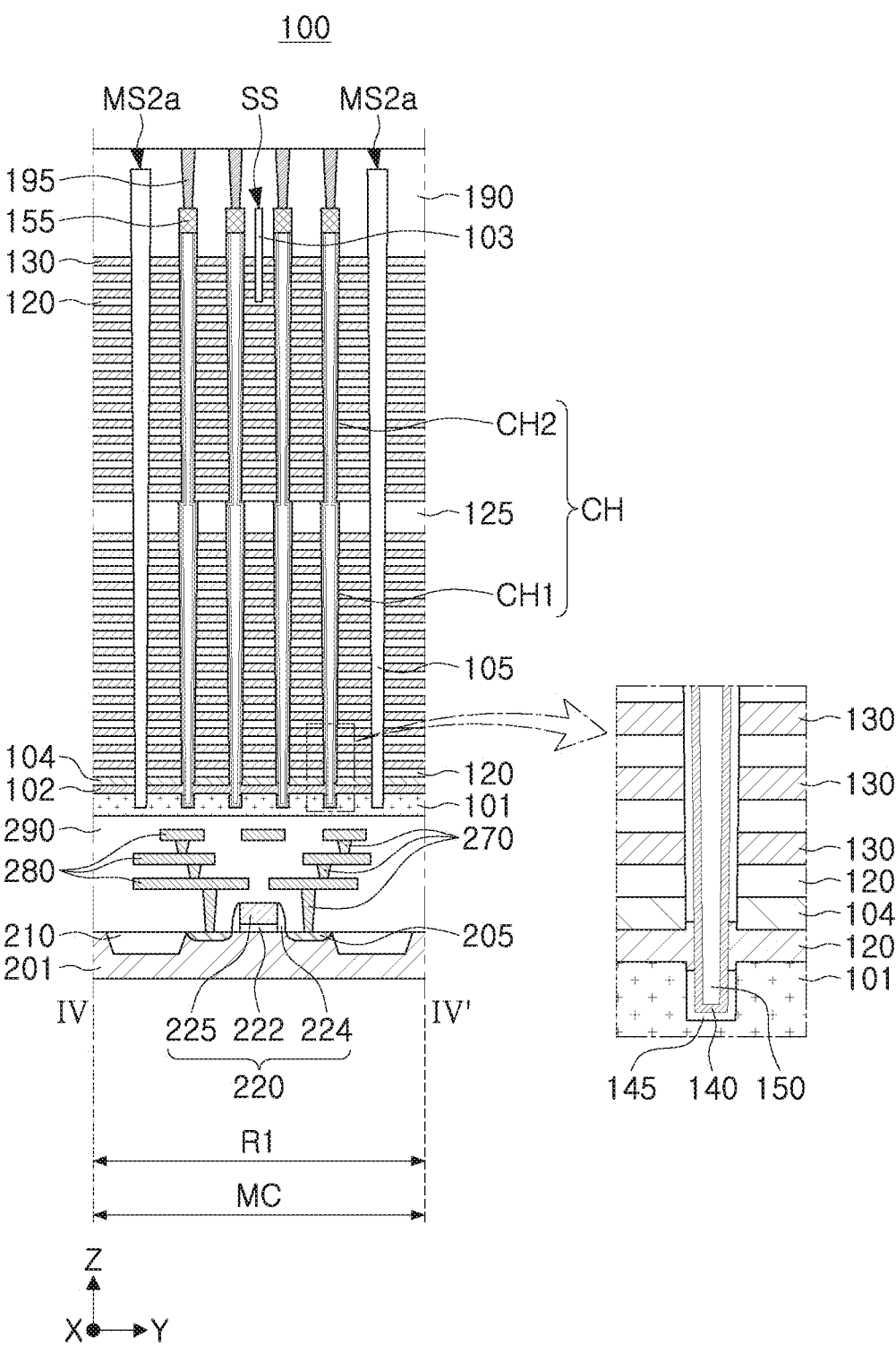

FIGS. 5A to 5C are a plan view and cross-sectional views illustrating a semiconductor device according to an example embodiment. FIG. 5B is a cross-sectional view taken along lines II-II' and III-III' in FIG. 5A, and FIG. 5C is a cross-sectional view taken along line IV-IV' in FIG. 5A.

Referring to FIGS. 5A to 5C, the semiconductor device 100 may include a memory device region MC in which memory cells are disposed and an align key region KEY in which align keys 180 are disposed. The align key region KEY may be a region disposed on an external side of the memory device region MC. In some example embodiments, the align key region KEY may be disposed in a scribe lane between the memory device regions MC, and in this case, the semiconductor device 100 may be a semiconductor structure before being diced.

The semiconductor device 100 may include a first semiconductor structure S1 including a first substrate 201 and a second semiconductor structure S2 including a second substrate 101. The second semiconductor structure S2 may be disposed on the first semiconductor structure S1. Alternately, in example embodiments, the second semiconductor structure S2 may be disposed below the first semiconductor structure S1.

The first semiconductor structure S1 may include a first substrate 201, source/drain regions 205 and device isolation layers 210 in the first substrate 201, circuit devices 220 disposed on the first substrate 201, circuit contact plugs 270, circuit interconnection lines 280, and a peripheral region insulating layer 290.

The first substrate 201 may have an upper surface extending in the x direction and the y direction. An active region may be defined in the first substrate 201 by the device isolation layers 210. The source/drain regions 205 including impurities may be disposed in a portion of the active region. The first substrate 201 may include a semiconductor material, such as, for example, a group IV semiconductor, a group III-V compound semiconductor, or a group II-VI compound semiconductor. The first substrate 201 may be provided as a bulk wafer or an epitaxial layer.

The circuit devices 220 may include a planar transistor. Each of the circuit devices 220 may include a circuit gate dielectric layer 222, a spacer layer 224, and a circuit gate electrode 225. The source/drain regions 205 may be disposed in the first substrate 201 on both sides of the circuit gate electrode 225.

The circuit contact plugs 270 and the circuit interconnection lines 280 may form a circuit interconnection structure electrically connected to the circuit devices 220 and the source/drain regions 205. The circuit contact plugs 270 may have a cylindrical shape, and the circuit interconnection lines 280 may have a line shape. The circuit contact plugs 270 and the circuit interconnection lines 280 may include a conductive material, such as, for example, tungsten (W), copper (Cu), or aluminum (Al), and each component may further include a diffusion barrier. However, in example embodiments, the number of layers and the arrangement of the circuit contact plugs 270 and the circuit interconnection lines 280 may be varied.

The peripheral region insulating layer 290 may be disposed to cover the circuit device 220 on the first substrate 201. The peripheral region insulating layer 290 may be formed of an insulating material and may include one or more insulating layers.

The first semiconductor structure S1 may include at least one of the above-described components in the align key region KEY. For example, the align key region KEY may include a peripheral region insulating layer 290. The circuit devices 220 and the circuit interconnection lines 280 may not be disposed in the align key region KEY, but an example embodiment thereof is not limited thereto.

The second semiconductor structure S2 may include a second substrate 101 having first and second regions R1 and R2, gate electrodes 130 stacked on the second substrate 101, interlayer insulating layers 120 alternately stacked with the gate electrodes 130, channel structures CH disposed to penetrate through the stack structure GS of the gate electrodes 130 in the first region R1, first and second isolation regions MS1, MS2a, and MS2b extending by penetrating through the stack structure GS of the gate electrodes 130, gate contacts 160 connected to end regions of the gate electrodes 130 in the second region R2 and extending vertically, through-vias 170 extending into the first semiconductor structure S1 from the second semiconductor structure S2, and align keys 180 extending by penetrating through a mold structure DS of the horizontal sacrificial layers 118. The second semiconductor structure S2 may further include a substrate insulating layer 121, first and second horizontal conductive layers 102 and 104 disposed below the gate electrodes 130, a horizontal insulating layer 110 disposed below the gate electrodes 130 on the second region R2, upper isolation regions SS penetrating a portion of the gate electrodes 130, support structures DCH disposed to penetrate through the stack structure GS of the gate electrodes 130 in the second region R2, substrate contacts 165 connected to the second substrate 101 and extending vertically, upper contacts 195 connected to the second substrate 101 extending vertically, upper contacts 195 disposed on the channel structures CH and the gate contacts 160, and a cell region insulating layer 190 covering the gate electrodes 130.

The first region R1 of the second substrate 101 may be a region on which the gate electrodes 130 may be vertically stacked and the channel structures CH may be disposed and memory cells may be disposed. The second region R2 of the second substrate 101 may be a region on which the gate electrodes 130 may extend to have different lengths, and the second region R2 may be used for electrically connecting the memory cells to the first semiconductor structure S1. The second region R2 may be disposed on at least one end of the first region R1 in at least one direction, that is, for example, the x direction. The second substrate 101 may not be disposed on the external side of the second region R2.

The second substrate 101 may also be referred to as a plate layer together with the substrate insulating layer 121, and may function as at least a portion of a common source line of the semiconductor device 100. The second substrate 101 may have an upper surface extending in the x direction and the y direction. The second substrate 101 may include a conductive material. For example, the second substrate 101 may include a semiconductor material, such as, for example, a group IV semiconductor, a group III-V compound semiconductor, or a group II-VI compound semiconductor. For example, the group IV semiconductor may include silicon, germanium, or silicon-germanium. The second substrate 101 may further include impurities. The second substrate 101 may be provided as a polycrystalline semiconductor layer such as a polycrystalline silicon layer or an epitaxial layer.

The first and second horizontal conductive layers 102 and 104 may be stacked in order on the upper surface of the second substrate 101 in the first region R1. The first horizontal conductive layer 102 may not extend to the second region R2, and the second horizontal conductive layer 104 may extend to the second region R2. The first horizontal conductive layer 102 may function as a portion of the common source line of the semiconductor device 100, that is, for example, as a common source line together with the second substrate 101. As illustrated in the enlarged view in FIG. 5C, the first horizontal conductive layer 102 may be directly connected to the channel layer 140 around the channel layer 140.

The second horizontal conductive layer 104 may be in contact with the second substrate 101 in a portion of regions of the second region R2 in which the first horizontal conductive layer 102 and the horizontal insulating layer 110 are not disposed. The second horizontal conductive layer 104 may be bent by covering an end of the first horizontal conductive layer 102 or the horizontal insulating layer 110 in the portion of the regions, and may extend to the second substrate 101.

The first and second horizontal conductive layers 102 and 104 may include a semiconductor material, such as polycrystalline silicon. In this case, at least the first horizontal conductive layer 102 may be doped with impurities of the same conductivity as that of the second substrate 101, and the second horizontal conductive layer 104 may be a doped layer or may include impurities diffused from the first horizontal conductive layer 102. However, the material of the second horizontal conductive layer 104 is not limited to a semiconductor material, and may be replaced with an insulating layer.

The horizontal insulating layer 110 may be disposed on the second substrate 101 on the same level as a level of the first horizontal conductive layer 102 in at least a portion of the second region R2. The horizontal insulating layer 110 may include first and second horizontal insulating layers 111 and 112 alternately stacked on the second region R2 of the second substrate 101. The horizontal insulating layer 110 may be layers remaining after a portion of the first horizontal conductive layer 102 is replaced with the first horizontal conductive layer 102 in the process of manufacturing the semiconductor device 100.

The horizontal insulating layer 110 may include silicon oxide, silicon nitride, silicon carbide, or silicon oxynitride. The first horizontal insulating layers 111 and the second horizontal insulating layer 112 may include different insulating materials. For example, the first horizontal insulating layers 111 may be formed of the same material as that of the interlayer insulating layers 120, and the second horizontal insulating layer 112 may be formed of a material different from that of the interlayer insulating layers 120.

The substrate insulating layer 121 may be disposed on the same level as a level of the second substrate 101, the horizontal insulating layer 110, and the second horizontal conductive layer 104. The substrate insulating layer 121 may be disposed on an external side and in the second region R2 of the second substrate 101, and may be further disposed in the first region R1. The substrate insulating layer 121 may be disposed in a region in which the through-vias 170 are disposed in the first and second regions R1 and R2, for example. The lower surface of the substrate insulating layer 121 may be coplanar with the lower surface of the second substrate 101 or may be disposed on a level lower than a level of the lower surface of the second substrate 101. The substrate insulating layer 121 may include an insulating material, such as, for example, silicon oxide, silicon nitride, silicon carbide, or silicon oxynitride.

The gate electrodes 130 may be vertically stacked and spaced apart from each other on the second substrate 101 and may form a stack structure GS together with the interlayer insulating layers 120. The stack structure GS may include vertically stacked lower and upper stack structures. However, in example embodiments, the stack structure GS may be formed in a single stack structure.

The gate electrodes 130 may include erase gate electrodes forming an erase transistor used in an erase operation, lower gate electrodes forming a gate of a ground selection transistor, memory gate electrodes forming a plurality of memory cells, and upper gate electrodes forming gates of string select transistors, from a lower portion. The number of the memory gate electrodes included in the memory cells may be determined depending on capacity of the semiconductor device 100. Also, a portion of the gate electrodes 130, that is, for example, the gate electrodes 130 adjacent to the lower gate electrode and/or the upper gate electrodes may be dummy gate electrodes.

As illustrated in FIG. 5A, the gate electrodes 130 may be spaced apart from each other in the y direction by the first isolation regions MS1 continuously extending in the first region R1 and the second region R2. The gate electrodes 130 between the pair of first isolation regions MS1 may form a memory block, but the example embodiment of the memory block is not limited thereto. A portion of the gate electrodes 130, that is, for example, the memory gate electrodes may form a single layer in a memory block.

The gate electrodes 130 may be vertically stacked and spaced apart from each other on the first region R1 and the second region R2, may extend by different lengths from the first region R1 to the second region R2, and may form a stepped structure in a staircase shape in a portion of the second region R2. The gate electrodes 130 may be disposed to have a stepped structure even in the y direction. Due to the stepped structure, in the gate electrodes 130, the lower gate electrode 130 may extend longer than the upper gate electrode 130, such that the gate electrodes 130 may have end regions in which upper surfaces may be exposed upwardly from the interlayer insulating layers 120 and the other gate electrodes 130, respectively, and may be connected to the gate contacts 160, respectively. The gate electrodes 130 may have an increased thickness in the end regions, but an example embodiment thereof is not limited thereto.

The gate electrodes 130 may include a metal material, such as, for example, tungsten (W). In example embodiments, the gate electrodes 130 may include polycrystalline silicon or a metal silicide material. In example embodiments, the gate electrodes 130 may further include a diffusion barrier, and for example, the diffusion barrier may include tungsten nitride (WN), tantalum nitride (TaN), or titanium nitride (TiN), or a combination thereof.

The interlayer insulating layers 120 may be disposed between the gate electrodes 130. Similarly to the gate electrodes 130, the interlayer insulating layers 120 may be disposed to be spaced apart from each other in a direction perpendicular to the upper surface of the second substrate 101 and to extend in the x direction. The interlayer insulating layers 120 may include an insulating material such as silicon oxide or silicon nitride.

The horizontal sacrificial layers 118 may be alternately stacked with the interlayer insulating layers 120 in the align key region KEY and may form the mold structure DS. The horizontal sacrificial layers 118 may have the same thickness as that of the gate electrodes 130, and may be disposed on the same level as a level of the gate electrodes 130. The horizontal sacrificial layers 118 may be formed of an insulating material different from that of the interlayer insulating layers 120. The horizontal sacrificial layers 118 may include, for example, silicon oxide, silicon nitride, or silicon oxynitride.

Each of the channel structures CH may form a memory cell string, and may be spaced apart from each other while forming rows and columns on the second substrate 101 in the first region R1. The channel structures CH may be disposed to form a grid pattern on the x-y plane or may be disposed in a zigzag pattern in one direction. The channel structures CH may have a columnar shape, and may have inclined side surface of which a width decreases toward the second substrate 101 depending on an aspect ratio. In example embodiments, at least a portion of the channel structures CH disposed on the end of the first region R1 may be dummy channels. In FIG. 5A, nine channel structures CH may be arranged in a zigzag pattern between first and second isolation regions MS1, MS2a, and MS2b adjacent to each other in the y direction, but the number of the channel structures CH is not limited thereto.

The channel structures CH may include vertically stacked first and second channel structures CH1 and CH2. The channel structures CH may have a shape in which the lower first channel structures CH1 are connected to the upper second channel structures CH2, and may have a bent portion due to a difference in width in the connection region. However, in example embodiments, the number of channel structures stacked in the z direction may be varied.

Each of the channel structures CH may include a channel layer 140, a gate dielectric layer 145, a channel filling insulating layer 150, and a channel pad 155 disposed in the channel hole. As illustrated in the enlarged view in FIG. 5C, the channel layer 140 may be formed in an annular shape surrounding the channel filling insulating layer 150 therein, but in example embodiments, the channel layer 140 may have a columnar shape such as a cylinder or a prism without the channel filling insulating layer 150. The channel layer 140 may be connected to the first horizontal conductive layer 102 in a lower portion. The channel layer 140 may include a semiconductor material such as polycrystalline silicon or single crystal silicon.

The gate dielectric layer 145 may be disposed between the gate electrodes 130 and the channel layer 140. Although not specifically illustrated, the gate dielectric layer 145 may include a tunneling layer, a charge storage layer, and a blocking layer stacked in order from the channel layer 140. The tunneling layer may tunnel electric charges into the charge storage layer, and may include, for example, silicon oxide ($SiO_2$), silicon nitride ($Si_3N_4$), silicon oxynitride (SiON), or a combination thereof. The charge storage layer may be a charge trap layer or a floating gate conductive layer. The blocking layer may include silicon oxide ($SiO_2$), silicon nitride ($Si_3N_4$), silicon oxynitride (SiON), a high-k dielectric material, or a combination thereof. In example embodiments, at least a portion of the gate dielectric layer 145 may extend in a horizontal direction along the gate electrodes 130.

The channel pad 155 may be disposed only on the upper end of the upper second channel structure CH2. The channel pad 155 may include, for example, doped polycrystalline silicon.

The channel layer 140, the gate dielectric layer 145, and the channel filling insulating layer 150 may be connected to each other between the first channel structure CH1 and the second channel structure CH2. An upper interlayer insulating layer 125 having a relatively thick thickness may be disposed between the first channel structure CH1 and the second channel structure CH2. However, the thicknesses and shapes of the interlayer insulating layers 120 and the upper interlayer insulating layer 125 may be varied in the example embodiments.

The support structures DCH may be spaced apart from each other while forming rows and columns on the second substrate 101 in the second region R2. As illustrated in FIG. 5A, each of the support structures DCH may be disposed to surround the gate contacts 160 in four directions. However, in example embodiments, the arrangement of the support structures DCH may be varied. The support structures DCH may have a columnar shape, and may have inclined side surfaces of which a width decreases toward the second substrate 101 depending on an aspect ratio.

The support structures DCH may have a circular shape, an elliptical shape, or a shape similar thereto on the x-y plane. A diameter or a maximum width of the support structures DCH may be greater than that of the channel structures CH, but an example embodiment thereof is not limited thereto. The support structures DCH may have a shape in which a bent portion is formed between a lower region and an upper region by a change in width to correspond to the through-via 170, but an example embodiment thereof is not limited thereto. For example, in example embodiments, the support structures DCH may have a size and shape corresponding to the first via layer 172 of the through-via 170.

The support structures DCH may have an internal structure the same as or different from the channel structures CH. For example, the support structures DCH may not include a conductive layer and may include an insulating material such as silicon oxide, silicon nitride, or silicon oxynitride.

The first and second isolation regions MS1, MS2a, and MS2b may extend in the x direction by penetrating through the gate electrodes 130. The first and second isolation regions MS1, MS2a, and MS2b may be disposed parallel to each other. The first and second isolation regions MS1, MS2a, and MS2b may penetrate an entirety of the gate electrodes 130 stacked on the second substrate 101, may further penetrate the first and second horizontal conductive layers 102 and 104 and the horizontal insulating layer 110 disposed therebelow, and may be connected to the second substrate 101. The first isolation regions MS1 may extend as an integrated region in the x direction, and the second isolation regions MS2 may intermittently extend between a pair of first isolation regions MS1 or may be disposed only in a portion of the regions. For example, the second central isolation regions MS2a may extend as an integrated region in the first region R1 and may intermittently extend in the x direction in the second region R2. The second auxiliary isolation regions MS2b may be disposed only in the second region R2 and may intermittently extend in the x direction. However, in example embodiments, the arrangement order and the number of the first and second isolation regions MS1, MS2a, and MS2b are not limited to the examples illustrated in FIG. 5A.

An isolation insulating layer 105 may be disposed in the first and second isolation regions MS1, MS2a, and MS2b.

The isolation insulating layer 105 may have a shape of which a width decreases toward the second substrate 101 due to a high aspect ratio, but an example embodiment thereof is not limited thereto, and the isolation insulating layer 105 may have a side surface perpendicular to the upper surface of the second substrate 101. The isolation insulating layer 105 may include an insulating material, such as, for example, silicon oxide, silicon nitride, or silicon oxynitride.

As illustrated in FIG. 5A, the upper isolation regions SS may extend in the x direction between the first isolation regions MS1 and the second central isolation region MS2a in the first region R1 and between the second central isolation regions MS2a in the first region R1. The upper isolation regions SS may be disposed in a portion of the second region R2 and the first region R1 to penetrate a portion of the gate electrodes 130 including an uppermost gate electrode 130. As illustrated in FIG. 5C, the upper isolation regions SS may isolate, for example, three gate electrodes 130 from each other in the y direction. However, the number of gate electrodes 130 isolated by the upper isolation regions SS may be varied in example embodiments. The upper isolation regions SS may include an upper isolation insulating layer 103. The upper isolation insulating layer 103 may include an insulating material, such as, for example, silicon oxide, silicon nitride, or silicon oxynitride.

The gate contacts 160 may be connected to end regions of the uppermost gate electrodes 130 in the second region R2. The gate contacts 160 may penetrate through at least a portion of the cell region insulating layer 190 and may be connected to the gate electrodes 130 exposed upwardly, respectively. In some example embodiments, the gate contacts 160 may penetrate an entirety of the stack structure GS, may penetrate the horizontal insulating layer 110, the second horizontal conductive layer 104, and the second substrate 101, and may be connected to the circuit interconnection lines 280 in the first semiconductor structure S1. In this case, the gate contacts 160 may be spaced apart from the other gate electrodes 130 disposed below each of the end regions by another insulating layer, and may also be spaced apart from the second horizontal conductive layer 104 and the second substrate 101.

The gate contacts 160 may include a conductive material, such as, for example, at least one of tungsten (W), copper (Cu), aluminum (Al), and an alloy thereof. In example embodiments, the gate contacts 160 may have an air gap therein.

The substrate contacts 165 may penetrate through the cell region insulating layer 190 and may be connected to the second substrate 101. The substrate contacts 165 may have a shape the same as or similar to that of the gate contacts 160, and may include the same material as that of the gate contacts 160.

The through-vias 170 may be disposed to electrically connect the memory cells of the second semiconductor structure S2 to the circuit devices 220 of the first semiconductor structure S1. The through-vias 170 may penetrate through the stack structure GS and may be connected to the circuit interconnection lines 280. The through-vias 170 may be disposed to penetrate through the stack structure of the horizontal sacrificial layers 118 and the interlayer insulating layers 120 in a region in which the horizontal sacrificial layers 118 remain in the stack structure GS. The through-vias 170 may be further disposed to penetrate through the stack structure of the horizontal sacrificial layers 118 and the interlayer insulating layers 120 also in the first region R1, and may be further disposed on an external side of the second substrate 101.

The through-via 170 may include first and second via layers 172 and 174 stacked in the z direction. Each of the first and second via layers 172 and 174 may be disposed on a level corresponding to each of the first and second align layers 182 and 184, respectively. The through-via 170 may have a structure corresponding to the support structure DCH. In the example embodiments, "corresponding structure" may indicate that a structure may be the same, or the structure may not be the same and only the scale is changed. The lower first via layer 172 may have a length relatively longer than that of the upper second via layer 174. The first via layer 172 may include an air gap AG therein, but an example embodiment thereof is not limited thereto. The second via layer 174 may have a diameter or width larger than that of the first via layer 172. The second via layer 174 may be disposed in the center of the first via layer 172. The first and second via layers 172 and 174 may overlap each other in the z direction. The entire second via layer 174 may overlap the first via layer 172 in the z direction. The through-vias 170 may include a conductive material, such as, for example, at least one of tungsten (W), copper (Cu), aluminum (Al), and an alloy thereof.

The align keys 180 may be disposed in the align key region KEY. As illustrated in FIG. 5A, the align keys 180 may be arranged in a predetermined pattern and may form the align key structures AK1 and AK2. The align key structures AK1 and AK2 may be regions in which align keys for alignment between upper and lower patterns are disposed in a photolithography process during the process of manufacturing the semiconductor device 100. However, the number of the align key structures AK1 and AK2, and the shape and size of the pattern formed by the align keys 180 in each of the align key structures AK1 and AK2 may vary in the example embodiments.

The align key 180 may extend into the first semiconductor structure S1 by penetrating through the mold structure DS and the substrate insulating layer 121. The align key 180 may be disposed on substantially the same level as a level of the through-via 170. An upper end of the align key 180 may be disposed on substantially the same level as a level of an upper end of the through-via 170. In some example embodiments, the lower end of the align key 180 may be disposed on a level lower than a level of a lower end of the through-via 170. The align key 180 may include first and second align layers 182 and 184 stacked in the z direction. The first and second align layers 182 and 184 may completely overlap each other in the z direction.

The lower first align layer 182 may be disposed on the same level as a level of the first via layer 172 and may have a length relatively longer than that of the upper second align layer 184. An upper end of the first align layer 182 may be disposed on a level the same as or similar to a level of an upper end of the first via layer 172 and an upper end of the support structure DCH. The first align layer 182 may include an air gap AG therein, but an example embodiment thereof is not limited thereto. The second align layer 184 may be disposed on the same level as a level of the second via layer 174 and may have a diameter or width smaller than that of the first align layer 182. The second align layer 184 may be disposed in the center of the first align layer 182 or may be shifted in one direction. The align keys 180 may include the same material as that of the through-vias 170. Also, the description of the align key 20 described in the aforementioned example embodiment with reference to FIGS. 1A and 1B may be applied to the align keys 180. Also, in example embodiments, the align keys 180 may be modified similarly to the align keys 20a, 20b, 20c, and 20d described in the aforementioned example embodiment with reference to FIGS. 2A to 4B.

The upper contacts 195 may form a cell interconnection structure electrically connected to the memory cells in the second semiconductor structure S2. The upper contacts 195 may be connected to the channel structures CH, the gate contacts 160, the substrate contacts 165, and the through-vias 170, and may be electrically connected to the channel structures CH and the gate electrodes 130. In example embodiments, the number of the contact plugs and wiring lines included in the cell interconnection structure may be varied. The upper contacts 195 may include a metal, such as, for example, tungsten (W), copper (Cu), aluminum (Al), or the like.

The cell region insulating layer 190 may be disposed to cover the second substrate 101, the stack structure GS of the gate electrodes 130, the mold structure DS, and the peripheral region insulating layer 290. The cell region insulating layer 190 may be formed of an insulating material, or may include a plurality of insulating layers.

The cell region insulating layer 190 may be formed of a light transmissive material at least on upper surfaces of the align keys 180 and the through-vias 170. For example, a region of the cell region insulating layer 190 covering the side surface of the second align layer 184 and disposed on the same level as a level of the second align layer 184 may be formed of a light transmissive material. Accordingly, when the cell interconnection structures such as the upper contacts 195 are formed, alignment may be performed using light passing through the cell region insulating layer 190 and reflected from the first align layer 182. However, the alignment may be performed using the second align layer 184.

Figure 6A:
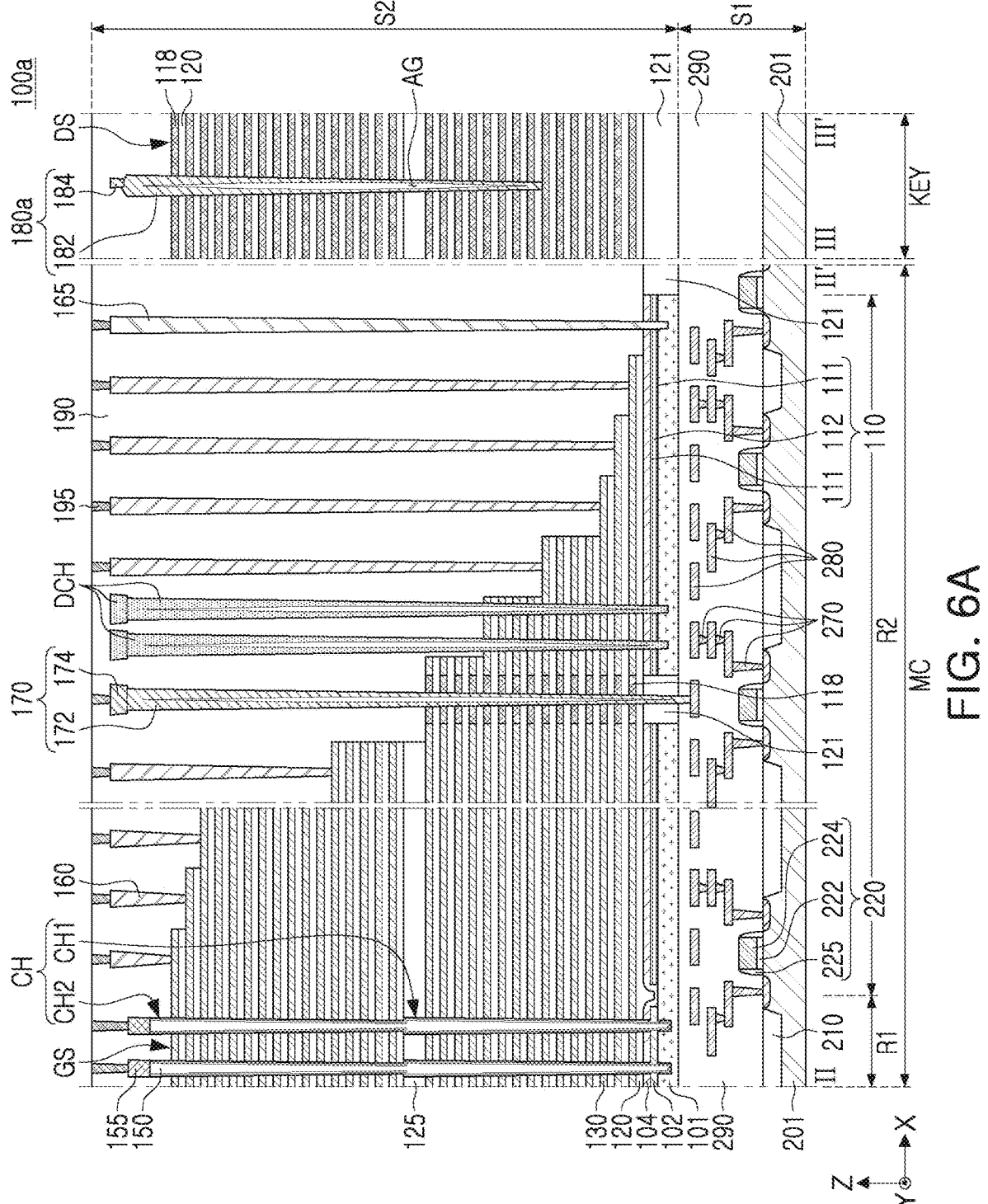
FIGS. 6A and 6B are cross-sectional views illustrating a semiconductor device according to an example embodiment of the present disclosure.
Figure 6B:
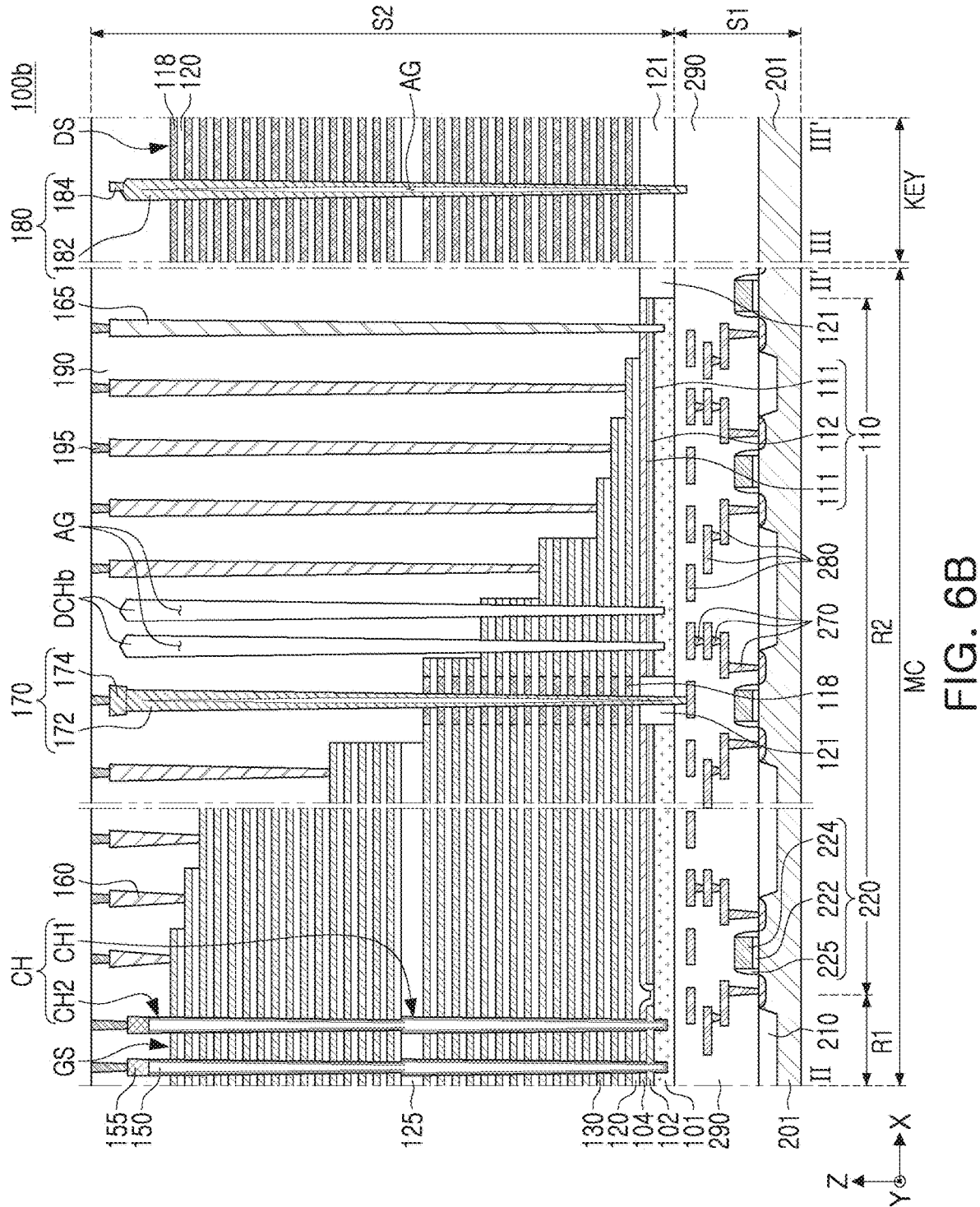

FIGS. 6A and 6B are cross-sectional views illustrating a semiconductor device according to an example embodiment, illustrating a region corresponding to FIG. 5B.

Referring to FIG. 6A, in the semiconductor device 100a, the shape of the align key 180a of the align key region KEY may be different from the example embodiment in FIG. 5B. The upper end of the align key 180a may be disposed on substantially the same level as a level of the upper end of the through-via 170, and the lower end of the align key 180a may be disposed on a level higher than a level of the lower end of the through-via 170. In the example embodiment, the align key 180a may penetrate only a portion of the mold structure DS and may not extend into the first semiconductor structure S1.

Such a structure may be formed due to a difference in width between the align key 180a and the through-via 170 in the x direction and/or the y direction. For example, in the example embodiment, the width of the align key 180a in the x direction may be smaller than the width of the through-via 170, but an example embodiment thereof is not limited thereto. In example embodiments, the level of the lower end of the align key 180a may be varied. For example, in some example embodiments, the lower end of the align key 180a may be disposed in the substrate insulating layer 121.

Referring to FIG. 6B, in the semiconductor device 100b, the support structures DCHb may only include the air gap AG. The support structures DCHb may be defined by the cell region insulating layer 190, the stack structure GS, the second horizontal conductive layer 104, the horizontal insulating layer 110, and the second substrate 101.

The upper ends of the support structures DCHb may be disposed on a level the same as or similar to a level of the upper end of the first via layer 172 and the upper end of the first align layer 182. However, since the through-via 170 and the align key 180 include the second via layer 174 and the second align layer 184, respectively, the positions of the upper ends of the first via layer 172 and the first align layer 182 may not be clearly recognized. The upper ends of the support structures DCHb may be disposed on a level lower than a level of the upper end of the through-via 170 and the upper end of the align key 180.

Figure 7:
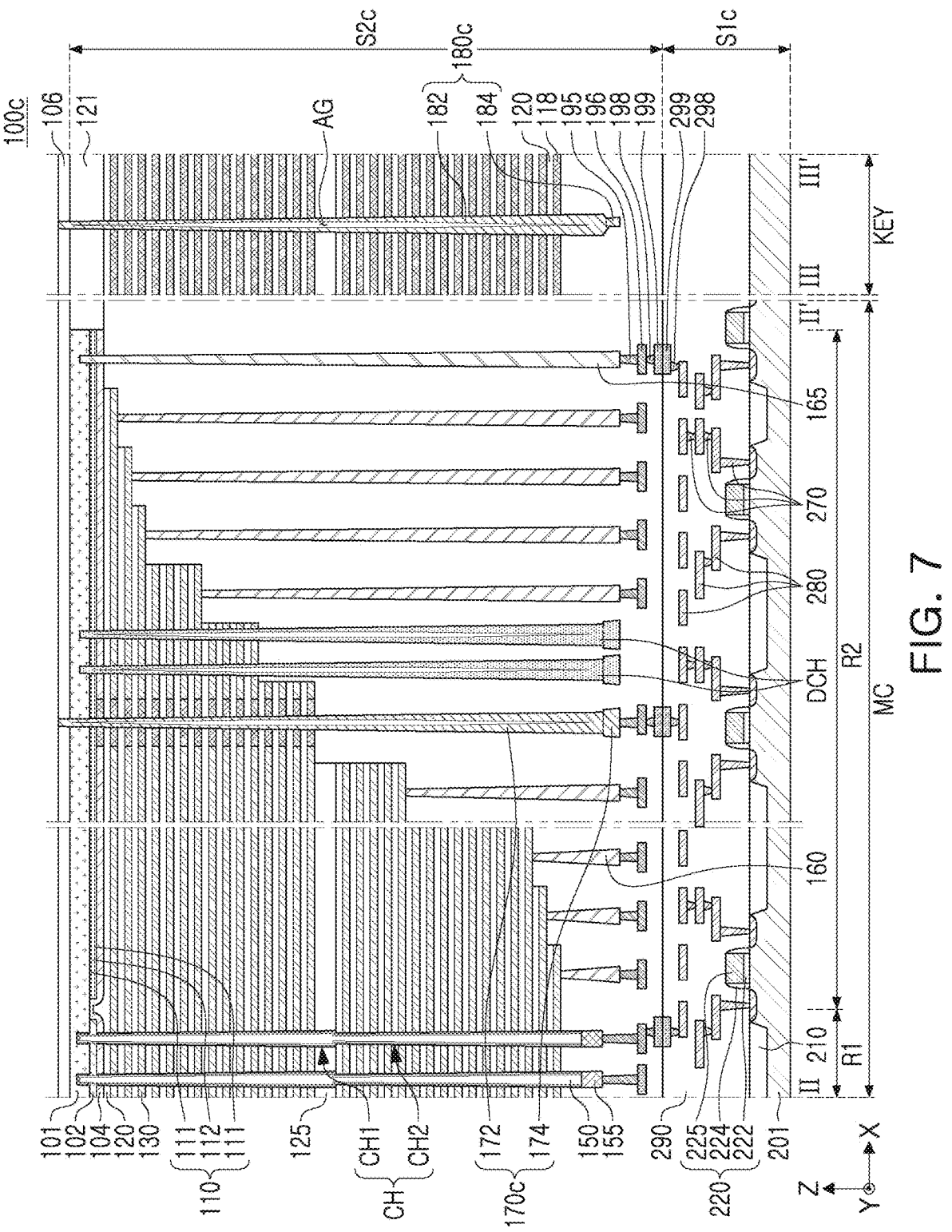
FIG. 7 is a cross-sectional view illustrating a semiconductor device according to an example embodiment of the present disclosure.

FIG. 7 is a cross-sectional view illustrating a semiconductor device according to an example embodiment, illustrating a region corresponding to FIG. 5B.

Referring to FIG. 7, a semiconductor device 100c may include a first semiconductor structure S1c and a second semiconductor structure S2c bonded by a wafer bonding method.

The description described in the aforementioned example embodiment with reference to FIGS. 5A to 5C may be applied to the first semiconductor structure S1c. However, the first semiconductor structure S1c may further include first bonding vias 298 and first bonding pads 299 which are bonding structures. The first bonding vias 298 may be disposed on uppermost circuit interconnection lines 280 and may be connected to the circuit interconnection lines 280. At least a portion of the first bonding pads 299 may be connected to the first bonding vias 298 on the first bonding vias 298. The first bonding pads 299 may be connected to the second bonding pads 199 of the second semiconductor structure S2c. The first bonding pads 299 together with the second bonding pads 199 may provide an electrical connection path according to the bonding between the first semiconductor structure S1c and the second semiconductor structure S2c. The first bonding vias 298 and the first bonding pads 299 may include a conductive material, such as, for example, copper (Cu).

The descriptions described with reference to FIGS. 1 to 3 may be applied to the second semiconductor structure S2c unless otherwise indicated. The second semiconductor structure S2c may further include cell interconnection lines 196 which are wiring structures, and may further include second bonding vias 198 and second bonding pads 199 which are bonding structures. The second semiconductor structure S2c may further include a passivation layer 106 covering the upper surface of the second substrate 101. In the second semiconductor structure S2c, the lower end of the through-via 170c may be exposed through the upper surface of the passivation layer 106.

The through-via 170c may penetrate through the stack structure GS and the substrate insulating layer 121 and may be exposed through the passivation layer 106 from the below. Although not illustrated, an input/output pad may be further disposed on the through-via 170c. However, in example embodiments, the through-via 170c may not be disposed in the second region R2, but may be disposed only on an external side of the gate electrodes 130.

The cell interconnection lines 196 may connect the upper contacts 195 to the second bonding vias 198. However, in example embodiments, the number of layers and the arrangement form of vias and wiring lines included in the wiring structure may be varied. The cell interconnection lines 196 may be formed of a conductive material, and may include, for example, at least one of tungsten (W), aluminum (Al), and copper (Cu).

The second bonding vias 198 and the second bonding pads 199 may be disposed below the cell interconnection lines 196. The second bonding vias 198 may be connected to the cell interconnection lines 196 and the second bonding pads 199, and the second bonding pads 199 may be bonded to the first bonding pads 299 of the first semiconductor structure S1c. The second bonding vias 198 and the second bonding pads 199 may include a conductive material, such as, for example, copper (Cu).

The first semiconductor structure S1c and the second semiconductor structure S2c may be bonded to each other by copper (Cu)-copper (Cu) bonding by the first bonding pads 299 and the second bonding pads 199. Other than the copper (Cu)-copper (Cu) bonding, the first semiconductor structure S1c and the second semiconductor structure S2c may be further bonded by dielectric-dielectric bonding. The dielectric-dielectric bonding may be bonding by dielectric layers forming a portion of each of the peripheral region insulating layer 290 and the cell region insulating layer 190 and surrounding the first bonding pads 299 and the second bonding pads 199, respectively. Accordingly, the first semiconductor structure S1c and the second semiconductor structure S2c may be bonded to each other without another adhesive layer.

FIGS. 8A to 8D are cross-sectional views illustrating a method of manufacturing a semiconductor device according to an example embodiment, illustrating a cross-section corresponding to FIG. 1B.

Figure 8A:
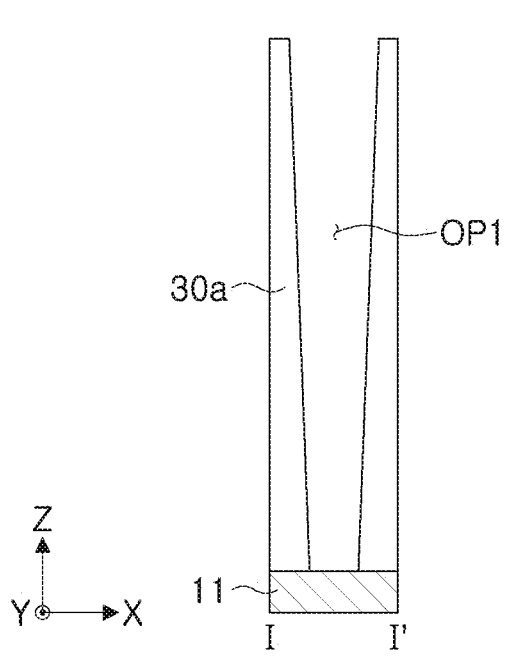
FIGS. 8A to 8D are cross-sectional views illustrating a method of manufacturing a semiconductor device according to an example embodiment of the present disclosure.

Referring to FIG. 8A, the lower layer 30a of the light transmissive layer 30 (see FIG. 1B) may be formed on the plate layer 11, and a first opening OP1 penetrating therethrough may be formed.

The lower layer 30a may be formed by a deposition process. The first opening OP1 may be formed by, for example, a dry etching process. The first opening OP1 may have a trench shape extending in the y direction, but an example embodiment thereof is not limited thereto.

Figure 8B:
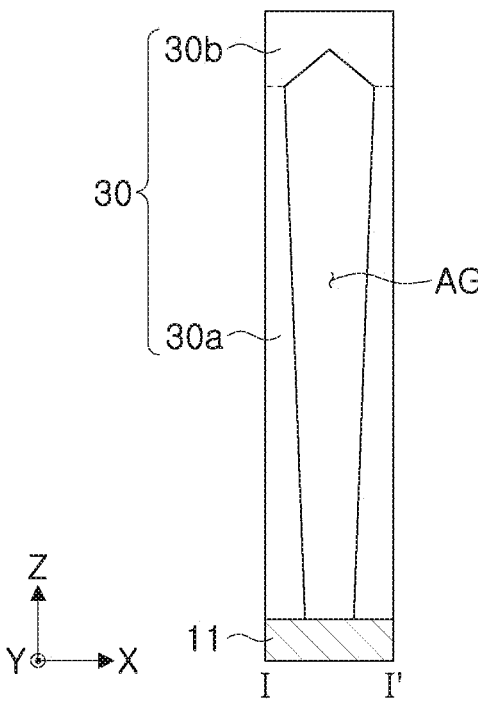

Referring to FIG. 8B, an air gap AG may be formed in the first opening OP1 by forming the upper layer 30b of the light transmissive layer 30.

The upper layer 30b may be a material the same as or different from the lower layer 30a. The upper layer 30b may be formed under a process condition with poor step-coverage such that the upper layer 30b may not fill the first opening OP1 and may cover an upper portion of the first opening OP1. Accordingly, an air gap AG may be formed in the first opening OP1. In this process, the air gap AG may be defined by the light transmissive layer 30 including the lower layer 30a and the upper layer 30b and the plate layer 11. However, in example embodiments, the shape of the upper end of the air gap AG and the thickness of the upper layer 30b on the air gap AG may be varied.

Figure 8C:
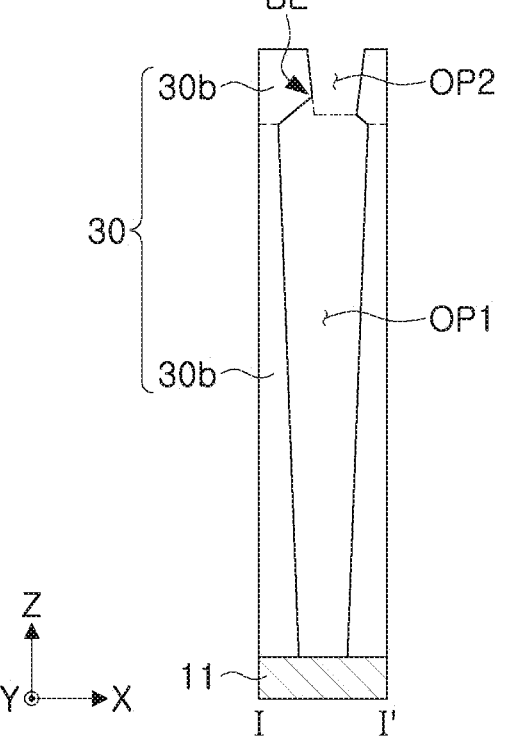

Referring to FIG. 8C, the second opening OP2 connected to the air gap AG may be formed.

A second opening OP2 penetrating through the upper layer 30b to open the air gap AG may be formed on the air gap AG. The second opening OP2 may be formed to have a width smaller than that of the first opening OP1. Accordingly, the bent portion BE may be formed between the first opening OP1 and the second opening OP2.

Figure 8D:
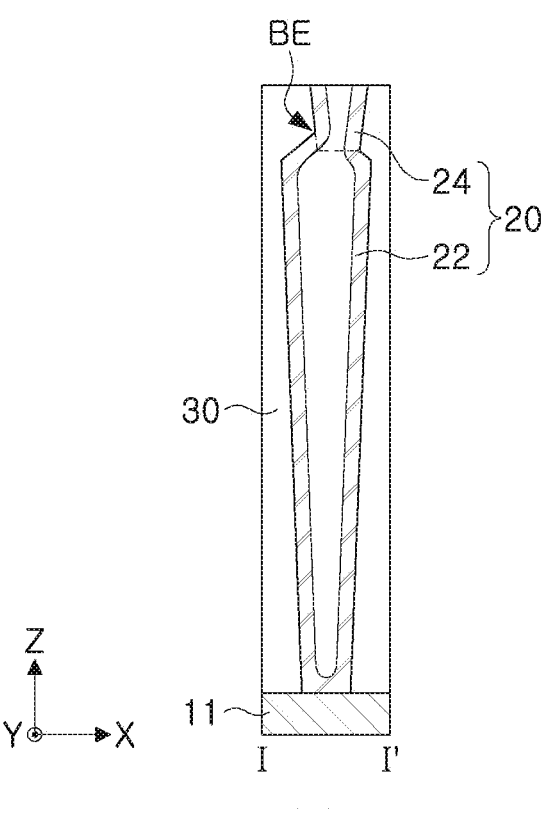

Referring to FIG. 8D, an align key 20 including first and second align layers 22 and 24 may be formed by depositing a reflective material in the first and second openings OP1 and OP2. FIG. 8D illustrates a state in which the reflective material is partially formed.

A deposition material may be supplied into the first opening OP1 through the second opening OP2. The reflective material may be deposited from the side surface of the second opening OP2 along the side surface and the bottom surface of the first opening OP1. Since the width of the second opening OP2 is relatively narrow, when deposition is performed to a certain thickness or more, the second opening OP2 may be filled with the deposition material and the deposition material may not be supplied to the first opening OP1. In this case, an air gap AG may be formed in the first opening OP1 as illustrated in FIG. 1B. The reflective material may be, for example, a metal material or a semiconductor material, but an example embodiment thereof is not limited thereto.

According to the example embodiment, the align key 20 may be formed by forming the second opening OP2 and forming the first and second align layers 22 and 24 including a reflective material through the second opening OP2.

When the process of forming the air gap is performed in the main region of the semiconductor device, the air gap AG may be formed even in the align key region including the align key 20, as illustrated in FIG. 8B. In this case, it may be difficult for the align key formed with the air gap AG to function as a transmissive align key in a subsequent process, such that the structure formed in the previous process may need to be used for alignment, and in this case, misalignment may increase. Therefore, even when the process of forming an air gap is performed in the main region, by forming the align key 180 including a reflective material through the second opening OP2 in the align key region as illustrated in FIGS. 8C and 8D, the align key 180 may be used for alignment in a subsequent process.

FIGS. 9A to 9I are cross-sectional views illustrating a method of manufacturing a semiconductor device according to an example embodiment, illustrating a cross-section corresponding to FIG. 5B.

Figure 9A:
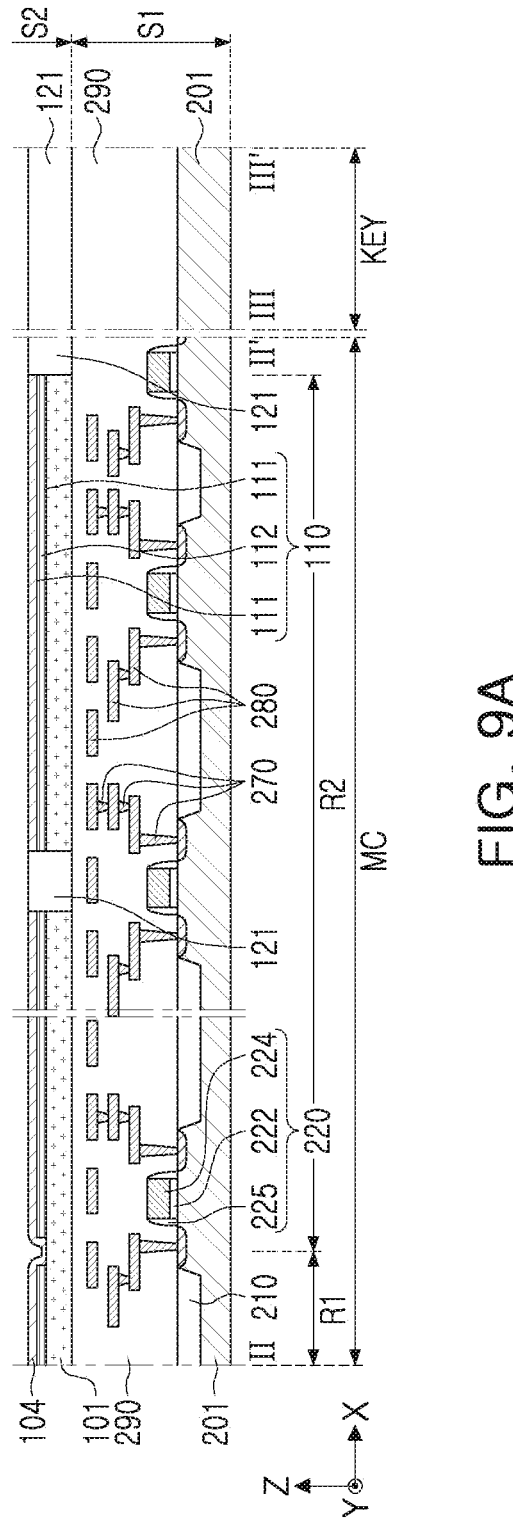
FIGS. 9A to 9I are cross-sectional views illustrating a method of manufacturing a semiconductor device according to an example embodiment of the present disclosure.

Referring to FIG. 9A, a first semiconductor structure S1, which is a peripheral circuit region including circuit devices 220 and circuit interconnection structures, may be formed on a first substrate 201, and a second substrate 101 on which the second semiconductor structure S2 which is a memory cell region is provided, a horizontal insulating layer 110, a second horizontal conductive layer 104, and a substrate insulating layer 121 may be formed.

First, device isolation layers 210 may be formed in the first substrate 201, and a circuit gate dielectric layer 222 and a circuit gate electrode 225 may be sequentially formed on the first substrate 201. The device isolation layers 210 may be formed by, for example, a shallow trench isolation (STI) process. The circuit gate dielectric layer 222 and the circuit gate electrode 225 may be formed using atomic layer deposition (ALD) or chemical vapor deposition (CVD). The circuit gate dielectric layer 222 may be formed of silicon oxide, and the circuit gate electrode 225 may be formed of at least one of polycrystalline silicon or a metal silicide layer, but an example embodiment thereof is not limited thereto. Thereafter, a spacer layer 224 and source/drain regions 205 may be formed on both sidewalls of the circuit gate dielectric layer 222 and the circuit gate electrode 225. In example embodiments, the spacer layer 224 may include a plurality of layers. Thereafter, the source/drain regions 205 may be formed by performing an ion implantation process.

The circuit contact plugs 270 of the circuit interconnection structures may be formed by partially forming the peripheral region insulating layer 290, removing a portion thereof by etching, and filling a conductive material. The circuit interconnection lines 280 may be formed by, for example, depositing a conductive material and patterning the material.

The peripheral region insulating layer 290 may include a plurality of insulating layers. A portion of the peripheral region insulating layer 290 may be formed in each process of forming the circuit interconnection structures, and a portion thereof may be formed on an uppermost circuit interconnection line 280, such that the peripheral region insulating layer 290 may be formed to cover the circuit devices 220 and the circuit interconnection structures.

Thereafter, the second substrate 101 may be formed on the peripheral region insulating layer 290. The second substrate 101 may be formed of, for example, polycrystalline silicon, and may be formed by a CVD process. Polycrystalline silicon included in the second substrate 101 may include impurities.

The first and second horizontal insulating layers 111 and 112 included in the horizontal insulating layer 110 may be alternately stacked on the second substrate 101. The horizontal insulating layer 110 may be partially replaced with the first horizontal conductive layer 102 in FIG. 5B through a subsequent process. The first horizontal insulating layers 111 may include a material different from that of the second horizontal insulating layer 112. For example, the first horizontal insulating layers 111 may be formed of the same material as that of the interlayer insulating layers 120, and the second horizontal insulating layer 112 may be formed of the same material as that of the subsequent horizontal sacrificial layers 118. The horizontal insulating layer 110 may be partially removed by a patterning process in a portion of regions, that is, for example, in the second region R2 of the second substrate 101. The second horizontal conductive layer 104 may be formed on the horizontal insulating layer 110 and may be in contact with the second substrate 101 in a region from which the horizontal insulating layer 110 is removed.

The substrate insulating layer 121 may be formed to penetrate the second substrate 101 in a region including the region in which the through-via 170 (see FIG. 5B) is disposed. The substrate insulating layer 121 may be formed by removing a portion of the second substrate 101, the horizontal insulating layer 110, and the second horizontal conductive layer 104, and filling an insulating material. After filling the insulating material, a planarization process may be further performed using a chemical mechanical polishing (CMP) process. Accordingly, the upper surface of the substrate insulating layer 121 may be substantially coplanar with the uppermost surface of the second horizontal conductive layer 104.

Figure 9B:
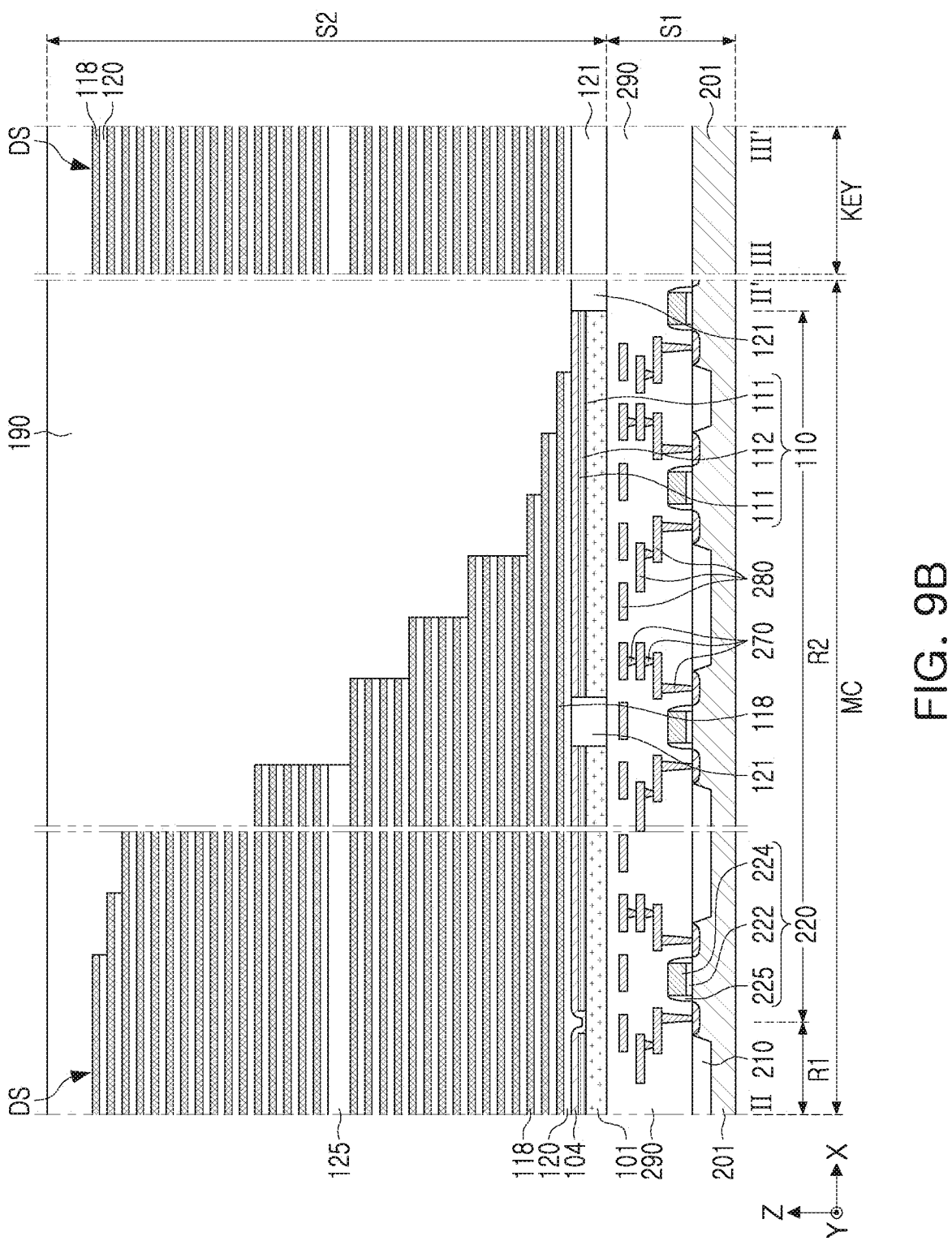

Referring to FIG. 9B, the mold structure DS may be formed by alternately stacking the interlayer insulating layers 120 and the horizontal sacrificial layers 118 on the second horizontal conductive layer 104.

The horizontal sacrificial layers 118 may be replaced with the gate electrodes 130 (see FIG. 5B) through a subsequent process. The horizontal sacrificial layers 118 may be formed of a material different from that of the interlayer insulating layers 120. For example, the interlayer insulating layer 120 may be formed of at least one of silicon oxide and silicon nitride, and the horizontal sacrificial layers 118 may be formed of a material different from that of the interlayer insulating layer 120, selected from among silicon, silicon oxide, silicon carbide, and silicon nitride. In example embodiments, the thicknesses of the interlayer insulating layers 120 may not be the same. Also, the thickness of the interlayer insulating layers 120 and the horizontal sacrificial layers 118 and the number of films thereof may be varied from the illustrated examples.

Thereafter, a photolithography process and an etching process may be repeatedly performed on the horizontal sacrificial layers 118 using a mask layer such that the upper horizontal sacrificial layers 118 may extend less than the lower horizontal sacrificial layers 118 in the second region R2. Accordingly, the horizontal sacrificial layers 118 may form a stepped structure in a step shape in a predetermined unit. Thereafter, horizontal sacrificial layers 118 may be further formed on the stepped structure, such that a sacrificial layer disposed on the uppermost portion may have a relatively thick thickness in each region.

Thereafter, a portion of the cell region insulating layer 190 covering the stack structure of the horizontal sacrificial layers 118 and the interlayer insulating layers 120 may be formed.

Figure 9C:
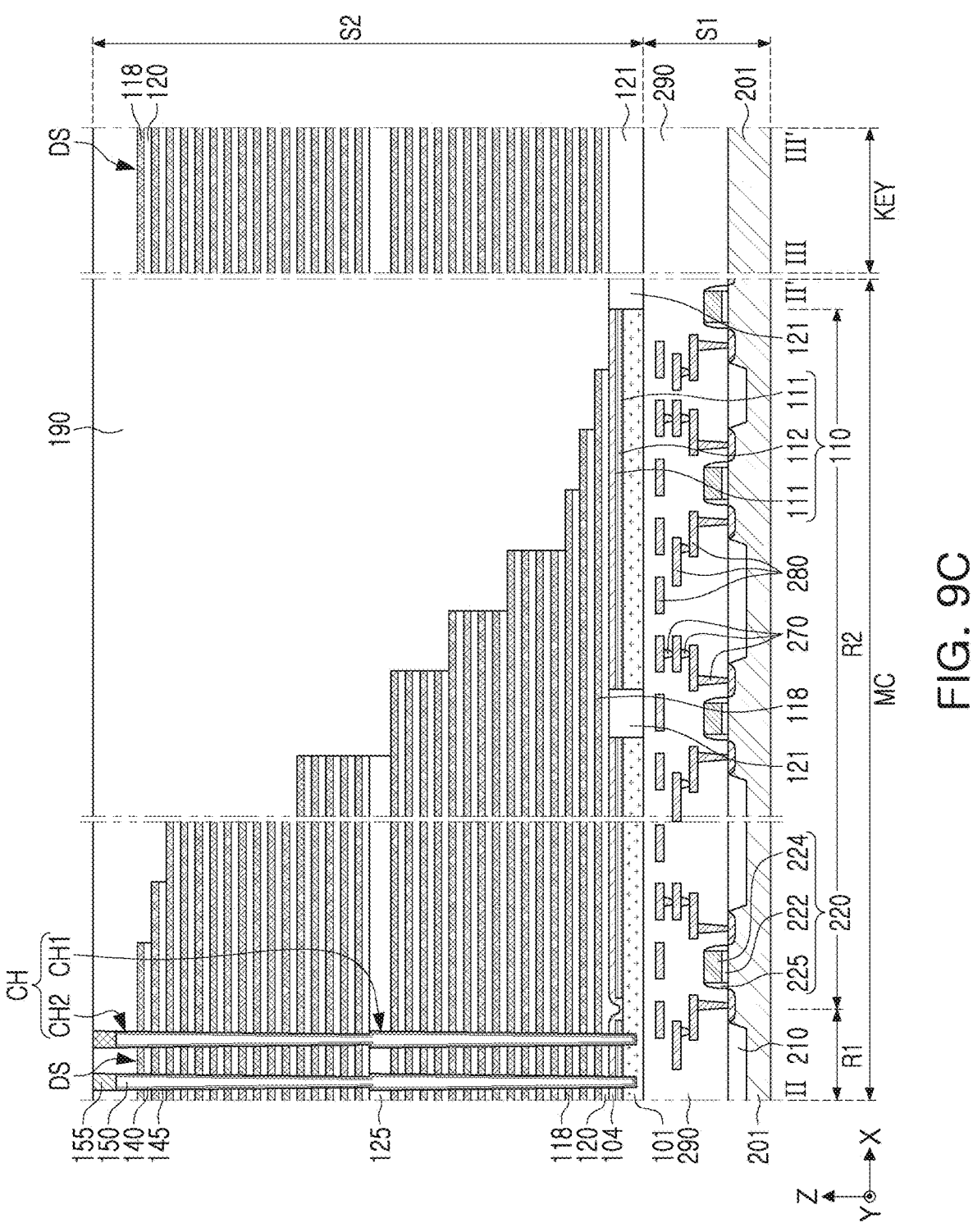

Referring to FIG. 9C, channel structures CH penetrating through the mold structure DS may be formed.

First, as illustrated in FIG. 5C, the upper isolation region SS may be formed by removing a portion of the horizontal sacrificial layers 118 and a portion of the interlayer insulating layers 120. To form the upper isolation region SS, the region in which the upper isolation region SS is to be formed may be exposed using a mask layer, a predetermined number of the horizontal sacrificial layers 118 and the interlayer insulating layers 120 may be removed from an uppermost portion, and an insulating material may be deposited, thereby forming the upper isolation insulating layer 103.

Thereafter, the channel structures CH may be formed by forming channel holes to penetrate through the mold structure DS in the first region R1 and filling the channel holes. Specifically, the channel structures CH may be formed by forming the gate dielectric layer 145, the channel layer 140, the channel filling insulating layer 150, and the channel pads 155 in the channel holes in order. The channel layer 140 may be formed on the gate dielectric layer 145 in the channel structures CH. The channel filling insulating layer 150 may be formed to fill the channel structures CH, and may be an insulating material. However, in example embodiments, the space between the channel layers 140 may be filled with a conductive material instead of the channel filling insulating layer 150. The channel pads 155 may be formed of a conductive material, such as, for example, polycrystalline silicon.

Figure 9D:
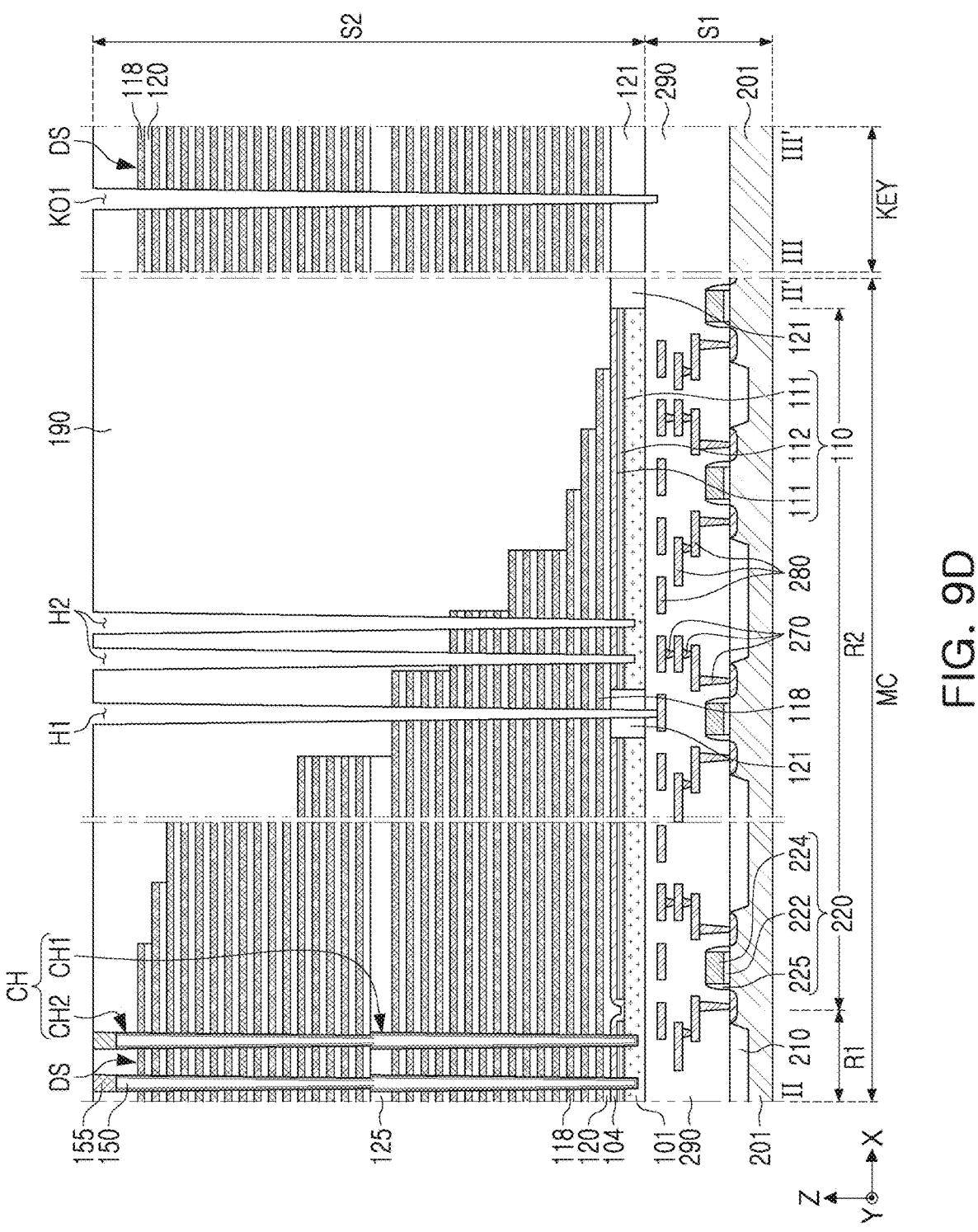

Referring to FIG. 9D, first and second holes H1 and H2 and a first key opening KO1 penetrating through the cell region insulating layer 190 and the mold structure DS and extending to the first semiconductor structure S1 may be formed.

The first and second holes H1 and H2 and the first key opening KO1 may be formed together using a patterned mask layer. The first and second holes H1 and H2 may be formed in a cylindrical shape, and the first key opening KO1 may be formed in a trench shape extending in the y direction.

The align key 180a of the example embodiment in FIG. 6a may be manufactured by forming a lower end of the key opening KO1 to be disposed on a relatively high level in this process.

Figure 9E:
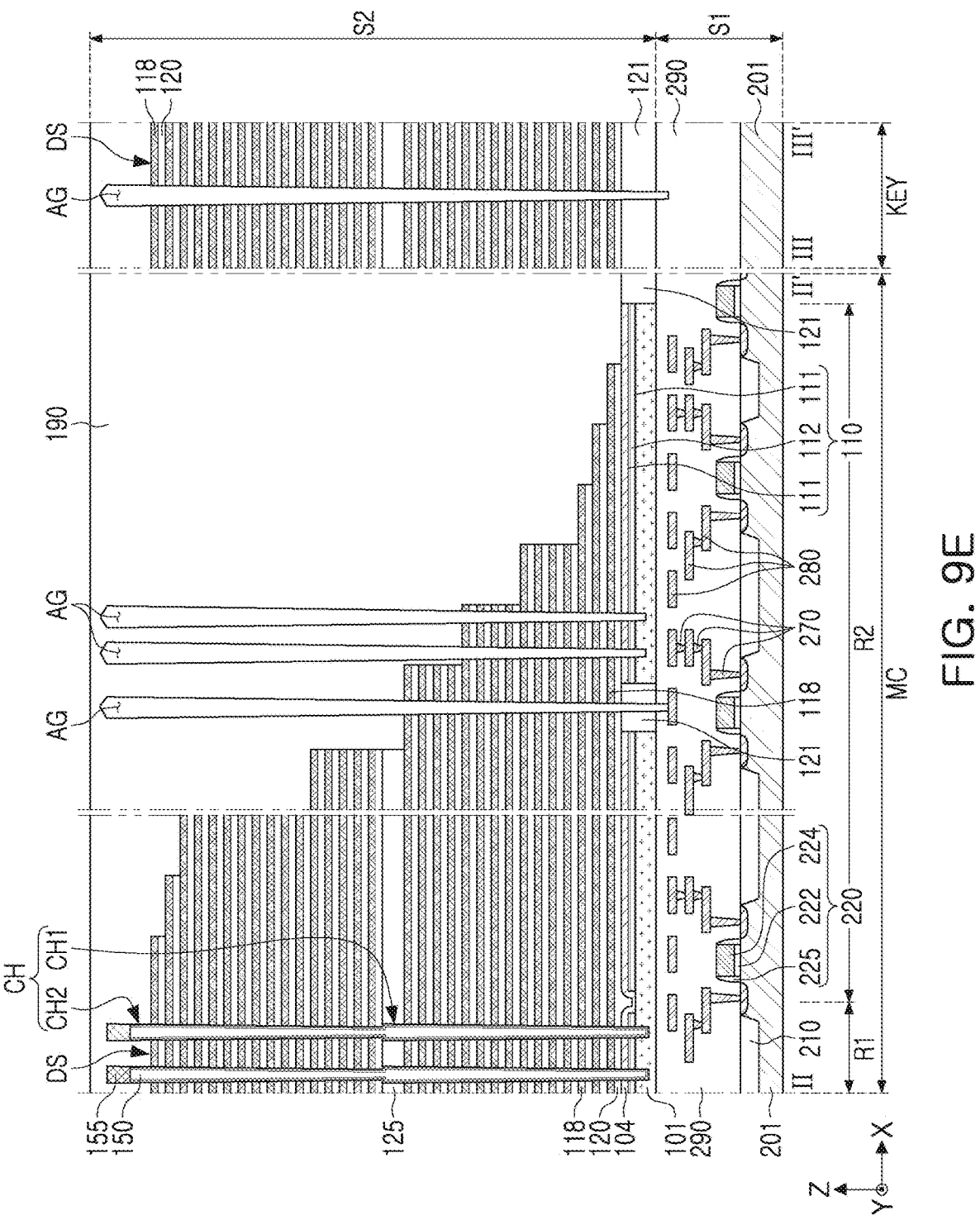

Referring to FIG. 9E, by further forming the cell region insulating layer 190, air gaps AG may be formed in the first and second lower holes H1 and H2 and the first key opening KO1.

This process may be performed the same as or similarly to the process described above with reference to FIG. 8B. The cell region insulating layer 190 additionally formed on the first and second lower holes H1 and H2 and the first key opening KO1 may be formed under process conditions with poor step-coverage. Accordingly, air gaps AG may be formed in the first and second lower holes H1 and H2 and the first key opening KO1. The upper ends of the air gaps AG may protrude to have an apex thereon, but the shape of the upper ends is not limited thereto.

Figure 9F:
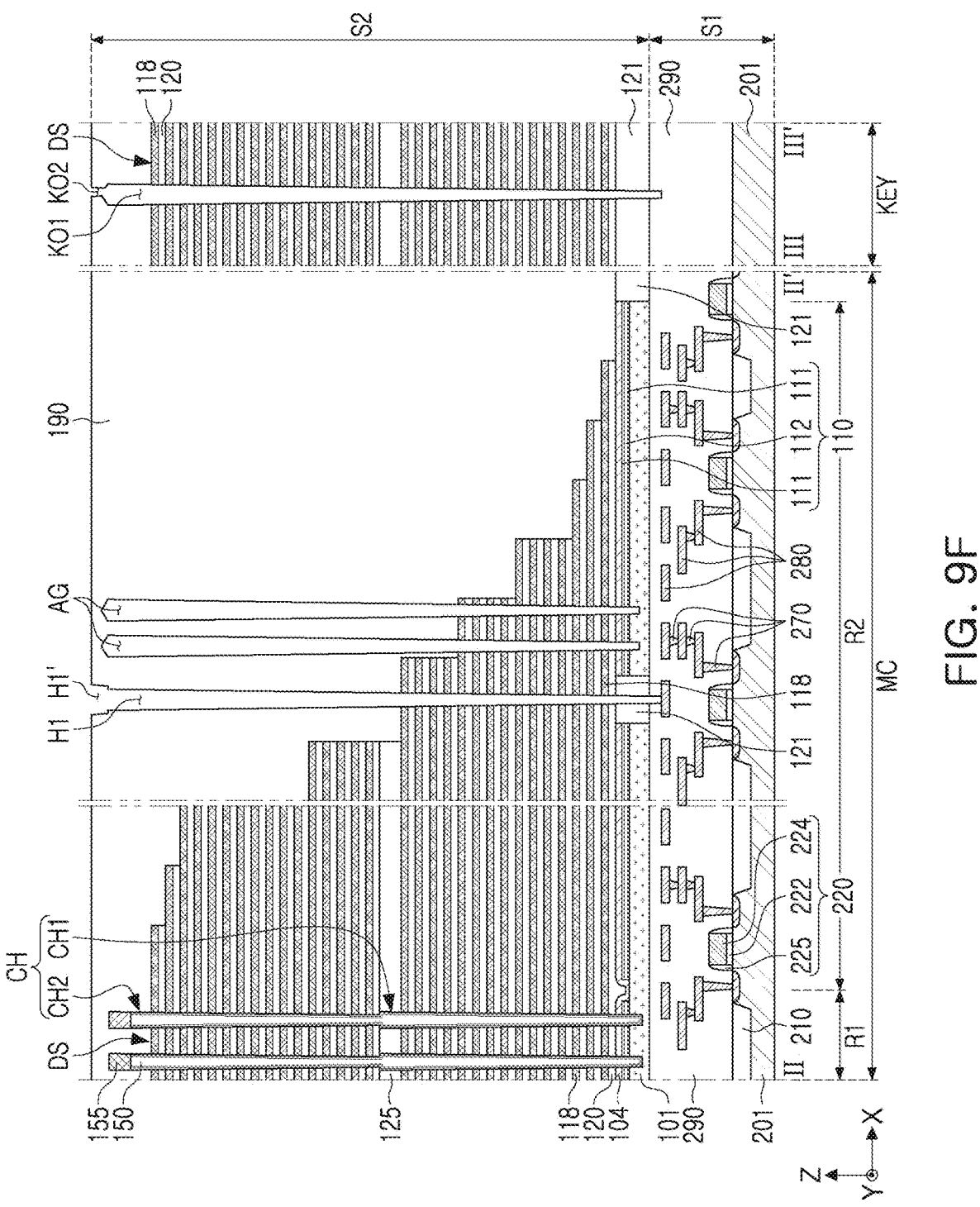

Referring to FIG. 9F, a first upper hole H1' and a second key opening KO2 connected to the air gaps AG of the first lower hole H1 and the first key opening KO1 may be formed.

This process may be performed the same as or similarly to the process described above with reference to FIG. 8C. However, in the memory device region MC, the first upper hole H1' may be formed to have a diameter larger than that of the first lower hole H1. A first upper hole H1' and a second key opening KO2 penetrating through the cell region insulating layer 190 and opening the air gaps AG on the first lower hole H1 and the first key opening KO1 may be formed using a patterned mask layer. In this process, the air gaps AG of the second lower holes H2 may not be opened by being covered with the mask layer.

The first upper hole H1' may be formed in a cylindrical shape, and the second key opening KO2 may be formed in a trench shape extending in the y direction. The first upper hole H1' may have a diameter larger than that of the first lower hole H1, and the second key opening KO2 may be formed to have a width smaller than that of the first key opening KO1. By changing the diameter and width, the boundary between the first lower hole H1 and the first upper hole H1' and the boundary between the first key opening KO1 and the second key opening KO2 may be distinct.

Figure 9G:
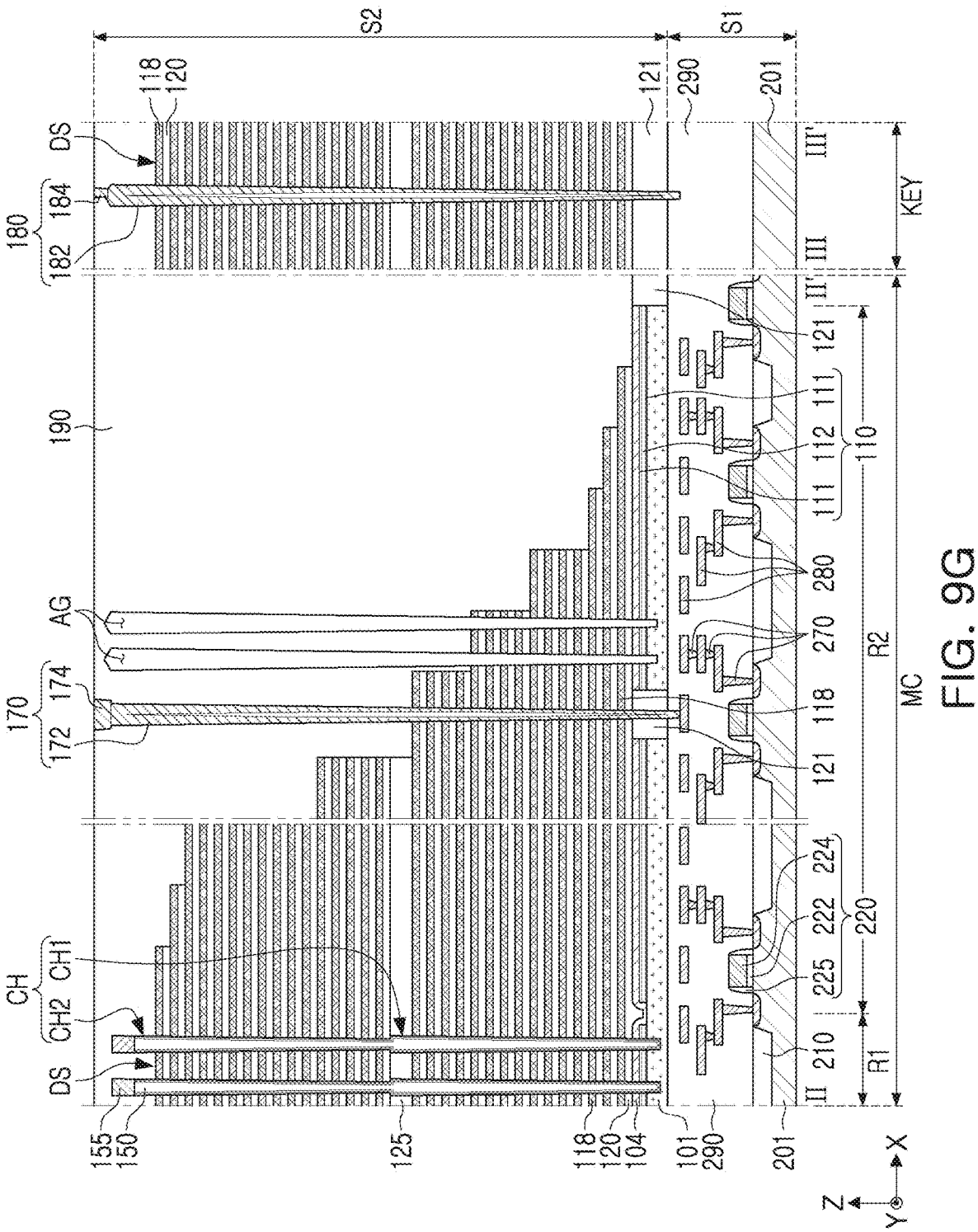

Referring to FIG. 9G, a through-via 170 and an align key 180 may be formed by depositing a conductive material in the first lower and upper holes H1 and H1' and the first and second key openings KO1 and KO2.

This process may be performed the same as or similarly to the process described above with reference to FIG. 8D. A conductive material may be supplied into the first lower hole H1 and the first key opening KO1 through the first upper hole H1' and the second key opening KO2. The conductive material may be formed from side surfaces of the first upper hole H1' and the second key opening KO2 along side surfaces and bottom surfaces of the first lower hole H1 and the first key opening KO1. Since the width of the second key opening KO2 is relatively narrow, when deposition is performed to a certain thickness, the second key opening KO2 may be filled with the conductive material, and the conductive material may not be supplied to the first key opening KO1. In this case, an air gap AG may be formed in the first key opening KO1. Since the first upper hole H1' has a diameter relatively larger than that of the first lower hole H1, the conductive material may be relatively easily filled. However, in example embodiments, even in this case, the air gap AG may be formed in the first lower hole H1 due to a high aspect ratio, but an example embodiment thereof is not limited thereto. In some example embodiments, by controlling the deposition condition of the conductive material, the air gaps AG may not be formed in the first lower hole H1 and the first key opening KO1 and the conductive material may be filled therein. The conductive material may be, for example, a metal material or a semiconductor material.

Through this process, the through-via 170 including the first via layer 172 of the first lower hole H1 and the second via layer 174 of the first upper hole H1' may be formed, and the align key 180 including the first align layer 182 of the first key opening KO1 and the second align layer 184 of the second key opening KO2 may be formed. Since the through-via 170 and the align key 180 are formed together through the same process, the through-via 170 and the align key 180 may include the same material.

Figure 9H:
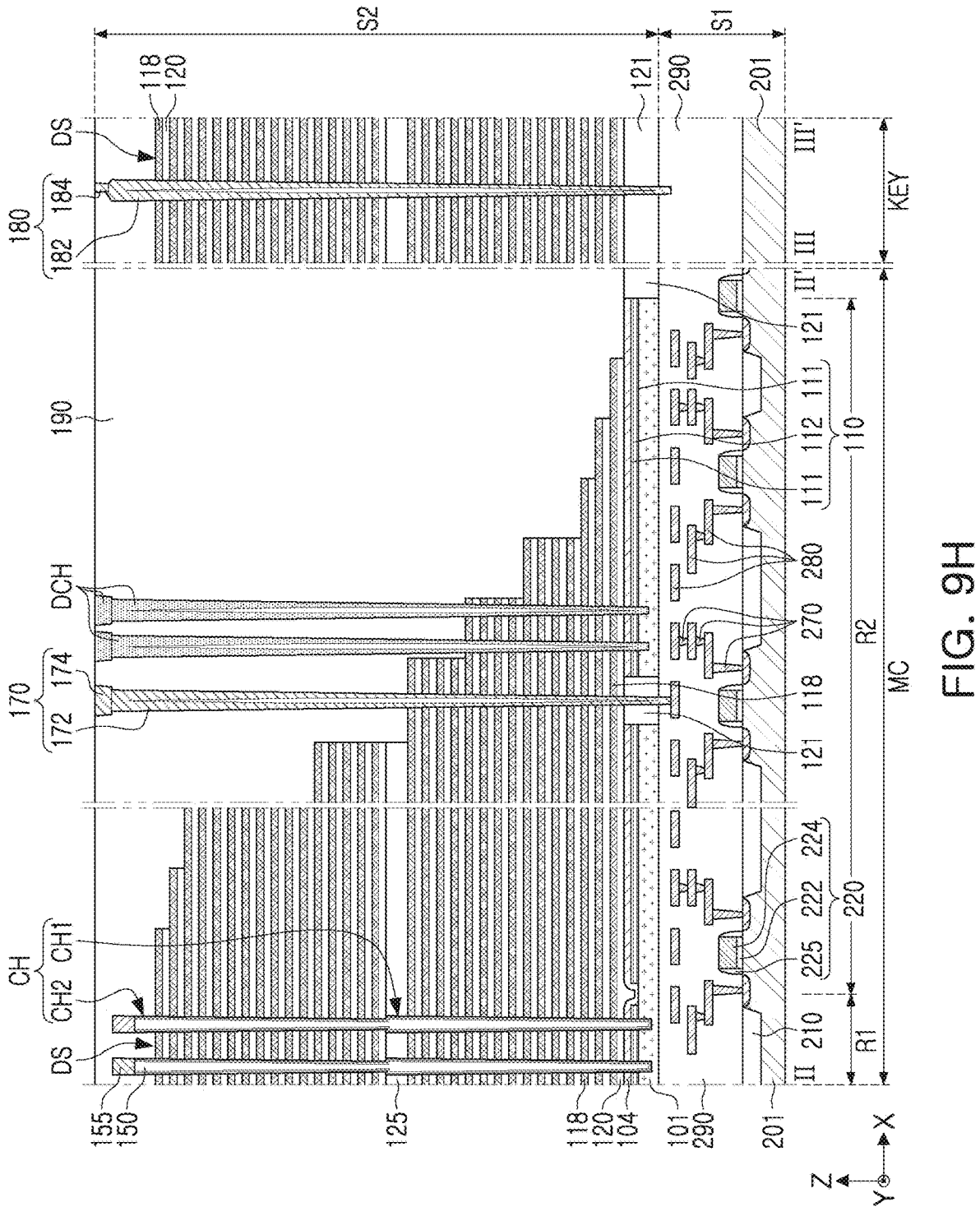

Referring to FIG. 9H, the support structures DCH may be formed by forming the second upper holes on the second lower holes H2 and filling an insulating material therein.

The second upper holes may be formed to open the air gaps AG in the second lower holes H2 in the same manner as the first upper hole H1' described above with reference to FIG. 9F. Thereafter, by depositing an insulating material in the second lower holes H2 and the second upper holes in the same manner as the through-via 170 described above with reference to FIG. 9G, the support structures DCH may be formed.

In some example embodiments, this process may not be provided, and in this case, the support structures DCH may have a structure including only the air gap AG as in the example embodiment in FIG. 6B.

Figure 9I:
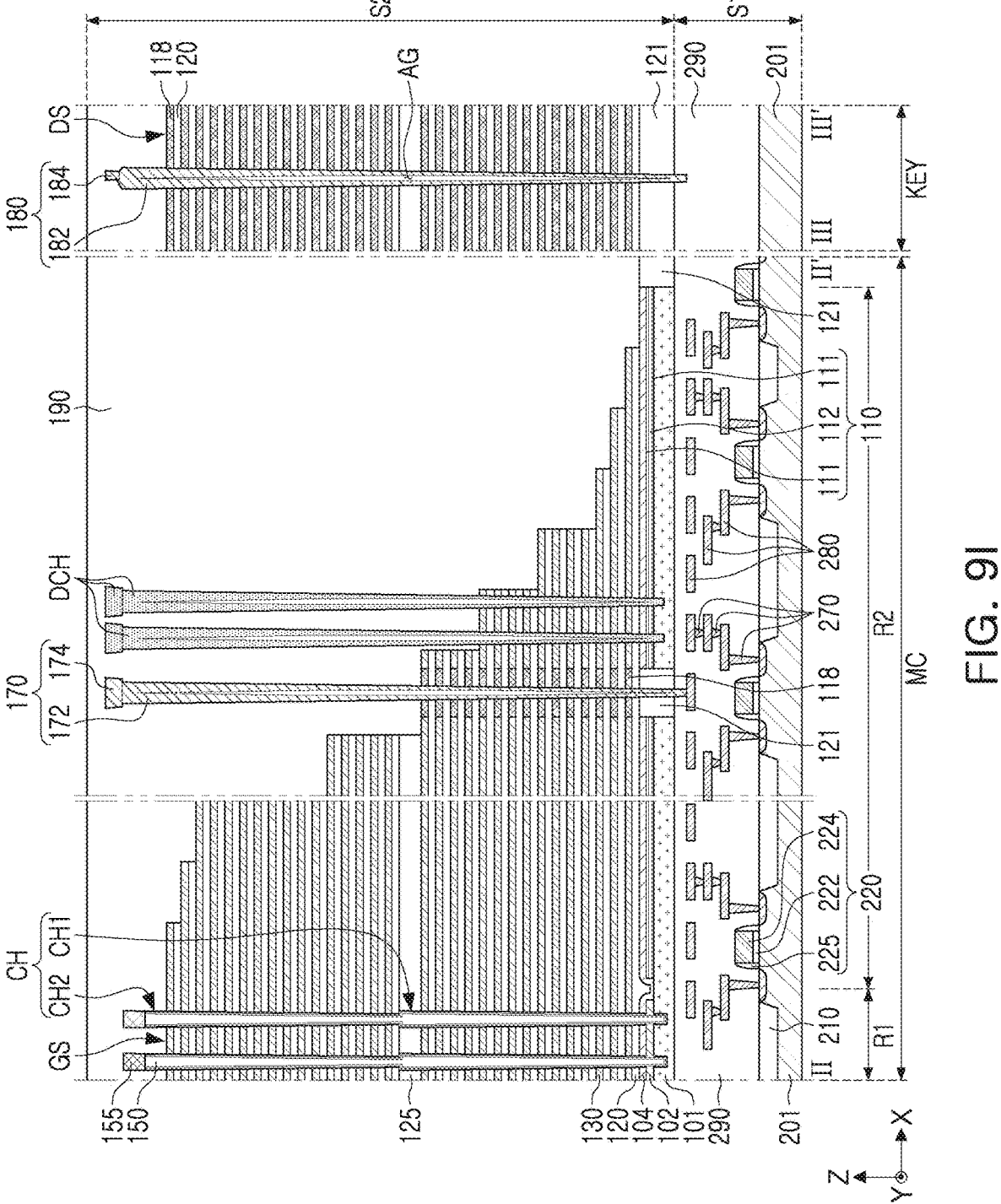

Referring to FIG. 9I, the first horizontal conductive layer 102 may be formed by partially removing the horizontal insulating layer 110, and the gate electrodes 130 may be formed by partially removing the horizontal sacrificial layers 118.

First, the cell region insulating layer 190 may be further formed, and openings penetrating through the mold structure DS and extending to the second substrate 101 may be formed in positions corresponding to the first and second isolation regions MS1, MS2a, and MS2b (see FIG. 5A). The openings may be formed in a trench shape extending in the x direction.

Thereafter, the horizontal insulating layer 110 may be partially removed. The second horizontal insulating layer 112 may be exposed by an etch-back process while forming separate sacrificial spacer layers in the openings. The exposed second horizontal insulating layer 112 may be selectively removed, and the upper and lower first horizontal insulating layers 111 may be removed. The horizontal insulating layer 110 may be removed by, for example, a wet etching process. In the process of removing the first horizontal insulating layers 111, a portion of the gate dielectric layer 145 exposed in the region from which the second horizontal insulating layer 112 is removed may also be removed. The first horizontal conductive layer 102 may be formed by depositing a conductive material in the region from which the horizontal insulating layer 110 is removed, and the sacrificial spacer layers may be removed from the openings. By this process, the first horizontal conductive layer 102 may be formed in the first region R1, and the horizontal insulating layer 110 may remain in the second region R2.

Thereafter, the horizontal sacrificial layers 118 may be selectively removed with respect to the interlayer insulating layers 120 using, for example, wet etching. The gate electrodes 130 may be formed by depositing a conductive material in the region from which the horizontal sacrificial layers 118 are removed. When a portion of the gate dielectric layer 145 extends horizontally along the gate electrodes 130, a portion of the gate dielectric layer 145 may be formed before the gate electrodes 130 in this process. The conductive material of the gate electrodes 130 may include, for example, a metal, polycrystalline silicon, or a metal silicide material.

After forming the gate electrodes 130, insulating material may be filled in the openings to form isolation insulating layers 105 (see FIG. 5A), thereby forming the first and second isolation regions MS1 and MS2a, MS2b) (see FIG. 5A).

Thereafter, with reference to FIGS. 5A to 5C, the gate contacts 160 connected to the gate electrodes 130 and the substrate contact 165 connected to the second substrate 101 may be formed, and upper contacts 195 may be formed, thereby manufacturing the semiconductor device 100.

In a photolithography process for forming at least one of the gate contacts 160, the substrate contact 165, the upper contacts 195, and the additional cell interconnection structure on the upper contacts 195, alignment may be performed on the already manufactured structure using the align key 180. In this case, differently from the example in which only the air gap structure is formed in the align key region KEY as illustrated in FIG. 9E, the align key 180 may include a reflective conductive material such that the align key 180 may be used as an align key. Since the upper second align layer 184 has a width smaller than that of the first align layer 182, the first align layer 182 may also be used for alignment. Accordingly, alignment accuracy may improve as compared to the example in which alignment is performed using the structure below the align key 180, that is, for example, the circuit interconnection line 280.

In some example embodiments, the process of forming the through-via 170 and the support structures DCH described above with reference to FIGS. 9F to 9H may not be performed on the memory device region MC, and the structure the same as the air gaps AG in FIG. 9E may remain in the memory device region MC and may be used as a component. Even in this case, in the align key region KEY, the process of forming the align key 180 described above with reference to FIGS. 9F and 9G may be performed, and the align key may be used in a subsequent process.

Figure 10:
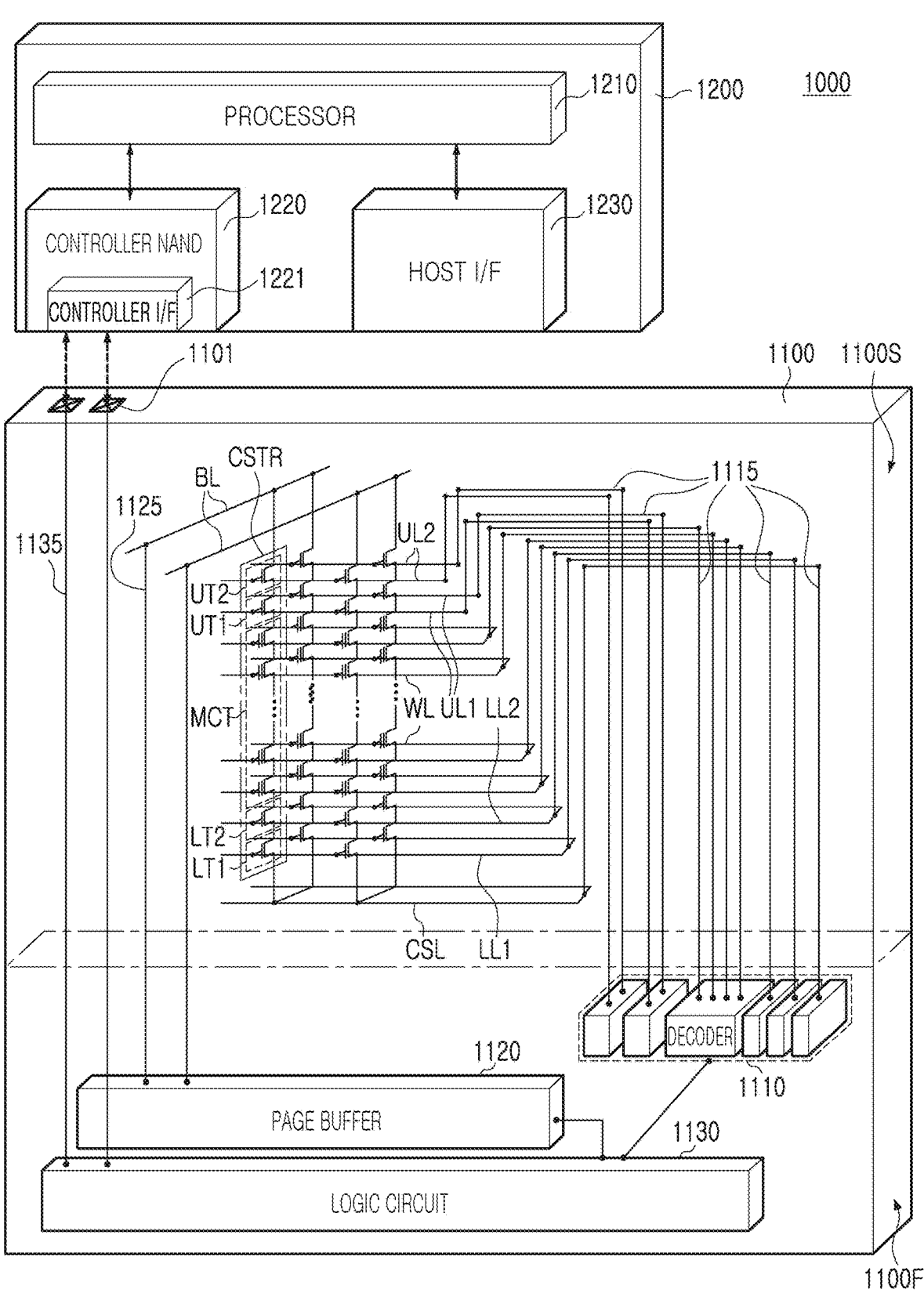
FIG. 10 is a view illustrating a data storage system including a semiconductor device according to an example embodiment of the present disclosure.

FIG. 10 is a view illustrating a data storage system including a semiconductor device according to an example embodiment.

Referring to FIG. 10, the data storage system 1000 may include a semiconductor device 1100 and a controller 1200 electrically connected to the semiconductor device 1100. The data storage system 1000 may be implemented as a storage device including one or a plurality of semiconductor devices 1100 or an electronic device including a storage device. For example, the data storage system 1000 may be implemented as a solid state drive device (SSD) including one or a plurality of semiconductor devices 1100, a universal serial bus (USB), a computing system, a medical device, or a communication device.

The semiconductor device 1100 may be implemented as a non-volatile memory device, such as, for example, the NAND flash memory device described in the aforementioned example embodiments with reference to FIGS. 5A to 7. The semiconductor device 1100 may include a first structure 1100F and a second structure 1100S on the first structure 1100F. In example embodiments, the first structure 1100F may be disposed on the side of the second structure 1100S. The first structure 1100F may be implemented as a peripheral circuit structure including a decoder circuit 1110, a page buffer 1120, and a logic circuit 1130. The second structure 1100S may be implemented as a memory cell structure including a bit line BL, a common source line CSL, word lines WL, first and second gate upper lines UL1 and UL2, first and second gate lower lines LL1 and LL2 and memory cell strings CSTR disposed between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be varied in example embodiments.

In example embodiments, the upper transistors UT1 and UT2 may include a string select transistor, and the lower transistors LT1 and LT2 may include a ground select transistor. The gate lower lines LL1 and LL2 may be configured as gate electrodes of the lower transistors LT1 and LT2, respectively. The word lines WL may be configured as gate electrodes of the memory cell transistors MCT, and the gate upper lines UL1 and UL2 may be configured as gate electrodes of the upper transistors UT1 and UT2, respectively.

In example embodiments, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT2 may be used in an erase operation for erasing data stored in the memory cell transistors MCT using a GIDL phenomenon.

The common source line CSL, the first and second gate lower lines LL1 and LL2, the word lines WL, and the first and second gate upper lines UL1 and UL2 may be electrically connected to the decoder circuit 1110 through first connection wirings 1115 extending from the first structure 1100F to the second structure 1100S. The bit lines BL may be electrically connected to the page buffer 1120 through second connection wirings 1125 extending from the first structure 110F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through the input/output pad 1101 electrically connected to the logic circuit 1130. The input/output pad 1101 may be electrically connected to the logic circuit 1130 through an input/output connection line 1135 extending from the first structure 1100F to the second structure 1100S.

The controller 1200 may include a processor 1210, a NAND controller 1220, and a host interface 1230. In example embodiments, the data storage system 1000 may include a plurality of semiconductor devices 1100, and in this case, the controller 1200 may control the plurality of semiconductor devices 1100.

The processor 1210 may control overall operation of the data storage system 1000 including the controller 1200. The processor 1210 may operate according to a predetermined firmware, and may access the semiconductor device 1100 by controlling the NAND controller 1220. The NAND controller 1220 may include a controller interface 1221 processing communication with the semiconductor device 1100. Through the controller interface 1221, a control command for controlling the semiconductor device 1100, data to be written to the memory cell transistors MCT of the semiconductor device 1100, and data to be read from the memory cell transistors MCT of the semiconductor device 1100 may be transmitted. The host interface 1230 may provide a communication function between the data storage system 1000 and an external host. When a control command from an external host is received through the host interface 1230, the processor 1210 may control the semiconductor device 1100 in response to the control command.

Figure 11:
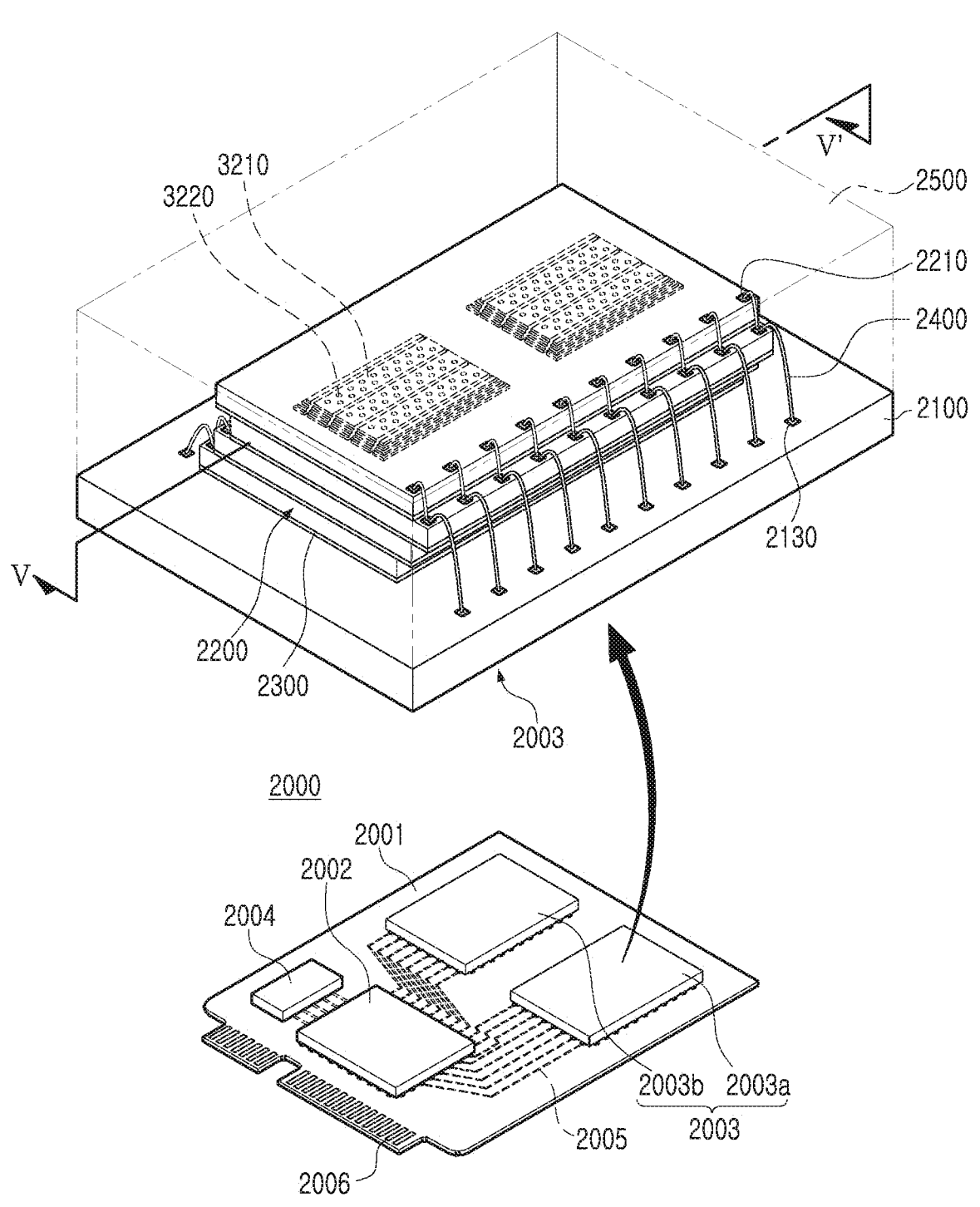
FIG. 11 is a perspective view illustrating a data storage system including a semiconductor device according to an example embodiment of the present disclosure.

FIG. 11 is a perspective view illustrating a data storage system including a semiconductor device according to an example embodiment.

Referring to FIG. 11, a data storage system 2000 in an example embodiment may include a main board 2001, a controller 2002 mounted on the main board 2001, one or more semiconductor packages 2003, and a DRAM 2004. The semiconductor package 2003 and the DRAM 2004 may be connected to the controller 2002 by wiring patterns 2005 formed on the main board 2001.

The main board 2001 may include a connector 2006 including a plurality of pins coupled to an external host. The number and arrangement of the plurality of pins in the connector 2006 may vary depending on a communication interface between the data storage system 2000 and the external host. In example embodiments, the data storage system 2000 may communicate with an external host according to one of interfaces from among universal serial bus (USB), peripheral component interconnect express (PCI-Express), serial advanced technology attachment (SATA), M-Phy for universal flash storage (UFS). In example embodiments, the data storage system 2000 may operate by power supplied from an external host through the connector 2006. The data storage system 2000 may further include a power management integrated circuit (PMIC) for distributing power supplied from the external host to the controller 2002 and the semiconductor package 2003.

The controller 2002 may write data to or may read data from the semiconductor package 2003, and may improve an operating speed of the data storage system 2000.

The DRAM 2004 may be configured as a buffer memory for alleviating a difference in speeds between the semiconductor package 2003, which is a data storage space, and an external host. The DRAM 2004 included in the data storage system 2000 may operate as a cache memory, and may provide a space for temporarily storing data in a control operation for the semiconductor package 2003. When the data storage system 2000 may include the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be configured as a semiconductor package including a plurality of semiconductor chips 2200. Each of the first and second semiconductor packages 2003a and 2003b may include a package substrate 2100, semiconductor chips 2200 on the package substrate 2100, adhesive layers 2300 disposed on lower surfaces of the semiconductor chips 2200, respectively, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit board including package upper pads 2130. Each semiconductor chip 2200 may include an input/output pad 2210. The input/output pad 2210 may correspond to the input/output pad 1101 in FIG. 10. Each of the semiconductor chips 2200 may include gate stack structures 3210 and channel structures 3220. Each of the semiconductor chips 2200 may include the semiconductor device described in the aforementioned example embodiment with reference to FIGS. 1 to 7.

In example embodiments, the connection structure 2400 may be configured as a bonding wire electrically connecting the input/output pad 2210 to the upper package pads 2130. Accordingly, in each of the first and second semiconductor packages 2003a and 2003b, the semiconductor chips 2200 may be electrically connected to each other by a bonding wire method, and may be electrically connected to the package upper pads 2130 of the package substrate 2100. In example embodiments, in each of the first and second semiconductor packages 2003a and 2003b, the semiconductor chips 2200 may be electrically connected to each other by a connection structure including a through-electrode (TSV) instead of the connection structure 2400 of a bonding wire method.

In example embodiments, the controller 2002 and the semiconductor chips 2200 may be included in a single package. In an example embodiment, the controller 2002 and the semiconductor chips 2200 may be mounted on a separate interposer substrate different from the main board 2001, and the controller 2002 and the semiconductor chips 2200 may be connected to each other wiring formed on the interposer substrate.

Figure 12:
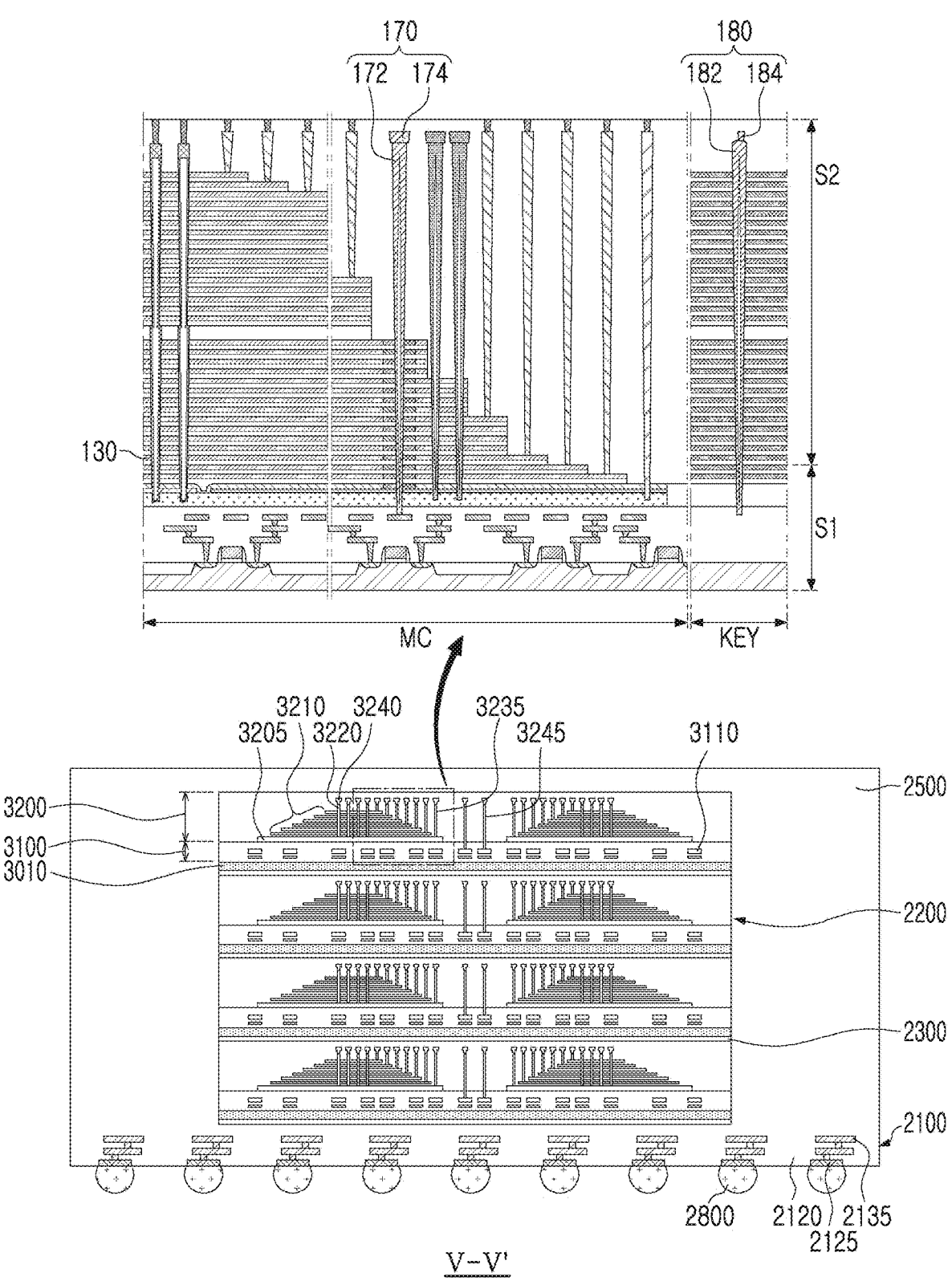
FIG. 12 is a cross-sectional view illustrating a semiconductor package according to an example embodiment of the present disclosure.

FIG. 12 is a cross-sectional view illustrating a semiconductor package according to an example embodiment, illustrating an example embodiment of the semiconductor package 2003 in FIG. 11 taken along line V-V' in FIG. 11.

Referring to FIG. 12, in the semiconductor package 2003, the package substrate 2100 may be implemented as a printed circuit board. The package substrate 2100 may include a package substrate body 2120, package upper pads 2130 (see FIG. 11) disposed on the upper surface of the package substrate body 2120, lower pads 2125 disposed on the lower surface of the package substrate body 2120 or exposed through the lower surface, and internal wirings 2135 electrically connecting the upper pads 2130 to the lower pads 2125 in the package substrate body 2120. The upper pads 2130 may be electrically connected to the connection structures 2400. The lower pads 2125 may be connected to the wiring patterns 2005 of the main board 2010 of the data storage system 2000 as illustrated in FIG. 11 through conductive connection portions 2800.

Each of the semiconductor chips 2200 may include a semiconductor substrate 3010 and a first structure 3100 and a second structure 3200 stacked in sequence on the semiconductor substrate 3010. The first structure 3100 may include a peripheral circuit region including peripheral wirings 3110. The second structure 3200 may include a common source line 3205, a gate stack structure 3210 on the common source line 3205, channel structures 3220 penetrating through the gate stack structure 3210 and isolation regions 3230, bit lines 3240 electrically connected to the memory channel structures 3220, and contact plugs 3235 electrically connected to the word lines WL (see FIG. 10) of the gate stack structure 3210. As described in the aforementioned example embodiment with reference to FIGS. 1 to 7, in each of the semiconductor chips 2200, the align key 180 for alignment during the manufacturing process may be disposed in one region of the second substrate 101. The align key 180 may include first and second align layers 182 and 184 stacked vertically.

Each of the semiconductor chips 2200 may include a through wiring 3245 electrically connected to the peripheral wirings 3110 of the first structure 3100 and extending into the second structure 3200. The through wiring 3245 may be disposed externally of the gate stack structure 3210, and may be further disposed to penetrate through the gate stack structure 3210. Each of the semiconductor chips 2200 may further include an input/output pad 2210 (see FIG. 11) electrically connected to the peripheral wirings 3110 of the first structure 3100.

According to the aforementioned example embodiments, by forming the align key to include the first and second align layers stacked vertically and using the align key in a subsequent process, a semiconductor device having improved reliability and a data storage system including the same may be provided.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While example embodiments have been illustrated and described above, it will be configured as apparent to those skilled in the art that modifications, variations, and combinations of embodiments could be made without departing from the scope of inventive concepts in the present disclosure as defined by the appended claims.

What is claimed is:

1. A semiconductor device, comprising:
a plate layer; and
an align key on the plate layer, wherein
the align key includes a first align layer and a second align layer connected to the first align layer,
the first align layer has a first length in a first direction, a second length in a second direction, and an air gap in the first align layer, wherein the air gap is covered from above by the first align layer,
the first direction is perpendicular to an upper surface of the plate layer,
the second length is smaller than the first length,
the second direction is perpendicular to the first direction,
the second align layer is on the first align layer, the second align layer has a third length, and
the third length is smaller than the second length in the second direction.

2. The semiconductor device of claim 1, wherein the first align layer and the second align layer form a single layer.

3. The semiconductor device of claim 1, wherein
the align key includes a bent portion according to a difference in width in a region in which the first align layer is connected to the second align layer.

4. The semiconductor device of claim 1, wherein an entirety of the second align layer overlaps the first align layer in the first direction.

5. The semiconductor device of claim 1, wherein
the first align layer has a fourth length in a third direction perpendicular to the second direction, and
the second align layer has a fifth length smaller than the fourth length in the third direction.

6. The semiconductor device of claim 1, wherein the second align layer has a sixth length smaller than the first length in the first direction.

7. The semiconductor device of claim 1, wherein the first align layer and the second align layer each include a reflective material.

8. The semiconductor device of claim 1, wherein
a width of a lower surface of the first align layer is smaller than a width of an upper surface of the first align layer, and
a width of a lower surface of the second align layer is smaller width than a width of an upper surface of the second align layer.

9. The semiconductor device of claim 1, wherein the second align layer is shifted from a central axis of the first align layer in the second direction.

10. The semiconductor device of claim 1, wherein a ratio of the first length to the second length is in a range of 10:1 to 100:1.

11. A semiconductor device, comprising:
a substrate including a plate layer;
an align key on the substrate,
the align key including a first align layer and a second align layer stacked in order in a first direction perpendicular to an upper surface of the plate layer,
the first align layer and the second align layer being connected to each other; and
a light transmissive layer on a side surface of the second align layer,
wherein the first align layer and the second align layer overlap each other in the first direction, and
wherein, in a plan view, the second align layer is within an outer perimeter of the first align layer.

12. The semiconductor device of claim 11, wherein
a length of the first align layer is different than a length of the second align layer in a second direction, and
the second direction is perpendicular to the first direction.

13. The semiconductor device of claim 11, wherein
the first align layer includes an air gap therein, and
the second align layer does not include an air gap.

14. The semiconductor device of claim 11, further comprising:
a vertical structure on the substrate, wherein
the semiconductor device includes a first region and a second region,
memory cells and the vertical structure are in the first region,
the align key is in the second region, and
a level of the vertical structure corresponds to a level of at least the first align layer.

15. The semiconductor device of claim 14, wherein
the vertical structure includes a first vertical structure layer and a second vertical structure layer,
the first vertical structure layer is on a same level as a level of the first align layer, and the second vertical structure layer is on a level corresponding to a level of the second align layer.

16. A data storage system, comprising:
a semiconductor storage device including a plate layer, circuit devices below the plate layer, and an input/output pad electrically connected to the circuit devices, the semiconductor storage device having a first region and a second region; and
a controller electrically connected to the semiconductor storage device through the input/output pad and configured to control the semiconductor storage device,
wherein the semiconductor storage device further includes:
a stack structure in the first region, the stack structure including gate electrodes stacked and spaced apart from each other in a first direction perpendicular to an upper surface of the plate layer,
a channel structure penetrating through the stack structure and in contact with the plate layer in the first region,
a through-via extending in the first direction and penetrating through the stack structure in the first region, the through-via being electrically connected to the circuit devices, and the through-via including a first via layer and a second via layer stacked in order in the first direction,
a mold structure including horizontal sacrificial layers stacked and spaced apart from each other in the first direction in the second region, and
an align key penetrating through the mold structure in the second region, the align key extending in the first direction, and the align key including a first align layer and a second align layer stacked in order in the first direction,
wherein the first align layer and the second align layer overlap each other in the first direction, and
wherein an air gap is in the first align layer, and the air gap is covered from above by the first align layer.

17. The data storage system of claim 16, wherein the first via layer and the second via layer overlap each other in the first direction.

18. The data storage system of claim 16, wherein a level of a lower end of the through-via is different from a level of a lower end of the align key.

19. The data storage system of claim 16, wherein;
the air gap extends in the first direction.

* * * * *